US006265959B1

(12) United States Patent
Abele et al.

(10) Patent No.: US 6,265,959 B1
(45) Date of Patent: *Jul. 24, 2001

(54) OPEN UNIPOLAR MAGNETIC STRUCTURE

(75) Inventors: Manlio G. Abele, New York; Jens Jensen, Yonkers; Henry Rusinek, Great Neck, all of NY (US)

(73) Assignee: New York University, New York, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/069,389

(22) Filed: Apr. 29, 1998

(51) Int. Cl.[7] .................................................. H01F 5/00
(52) U.S. Cl. ................................. 335/299; 335/296
(58) Field of Search ................................ 335/296, 297, 335/298, 299, 301, 302, 304, 306; 324/318, 319, 320, 321

(56) References Cited

U.S. PATENT DOCUMENTS 5,361,054 * 11/1994 Knuettel ................................ 335/216
5,475,355    12/1995 Abele et al. .

(List continued on next page.)

FOREIGN PATENT DOCUMENTS

407227
A2-A3    7/1990  (EP) .............................. G01R/33/38

OTHER PUBLICATIONS

Abele et al. "Strapping Techniques For Permanent Magnets", IEEE Transactions On Magnetics, 32/5, Sep. 1996, pp. 5082–5084.

M.G. Abele "Structures Of Permanent Magnets", published by John Wiley and Sons, New York, 1993, pp. 163–171.

Abele MG., "Generation of Highly Uniform Field with Permanent Magnets" (Invited), J Appl Physics 76(10), 6247–6252, 1994.

Abele et al. "Linear Theory of Pole Piece Design in Permanent Magnets", Proceedings of the Thirteenth International Workshop on Rare–Earth Magnets and their Applications, Birmingham, U.K., Sep. 1994.

*Primary Examiner*—Lincoln Donovan
(74) *Attorney, Agent, or Firm*—Darby & Darby

(57) ABSTRACT

A magnetic structure generating a uniform magnetic field within a region of interest using permanently magnetized prism-shaped blocks of magnetic material positioned around a cavity and which constitute the predominant generator of the uniform magnetic field in the desired region of interest. The magnetic structure has a plane surface comprising a high permeability ferromagnetic member interfacing with a first side of the cavity and forming a single pole piece of the magnetic structure. The magnetic structure produces within the cavity adjacent the single pole piece the uniform magnetic field and collects the magnetic flux flowing through the single pole piece and through the cavity, with the region of interest being located adjacent the single pole piece. A second side of the cavity generally opposite to the first side is open to a surrounding medium and forms an interface with the surrounding medium but not with a magnetic member. The magnetic structure is designed assuming a hypothetical high permeability membrane parallel to the single pole piece and located where the open second side of the cavity will be made, the high permeability membrane forming an equipotential surface at the interface with the surrounding medium. This minimizes the fringe field generated in the surrounding medium when the second side of the cavity is opened.

17 Claims, 28 Drawing Sheets

U.S. PATENT DOCUMENTS

| | | |
|---|---|---|
| 5,495,222 | 2/1996 | Abele et al. . |
| 5,519,372 * | 5/1996 | Palkovich et al. .................. 335/216 |
| 5,557,205 * | 9/1996 | Ohta et al. ........................... 324/319 |
| 5,621,324 * | 4/1997 | Ota et al. ............................. 324/319 |

* cited by examiner

OPEN UNIPOLAR MAGNETIC STRUCTURE

The invention is directed to a magnetic structure for generating a highly uniform magnetic field using permanently magnetized blocks of magnetic material as the predominant generator of the uniform magnetic field in a desired region of interest.

BACKGROUND OF INVENTION

Commonly-owned U.S. Pat. Nos. 5,475,355 and 5,495,222, whose contents are herein incorporated by reference, describe, among other things, a generally C-shaped magnetic structure for generating uniform magnetic fields in a region of interest, for example, for use in magnetic resonance imaging (MRI) by means of a relatively open magnetic structure allowing surgical intervention during an MRI procedure. Among the features described in those two patents are various schemes for compensating for field distortions introduced by, among other things, the opening of the structure.

A commonly-owned, copending application, Ser. No. 08/754,916, filed Nov. 22, 1996, whose contents, including the contents of the patents incorporated by reference in the said copending application and the contents of a continuation-in-part application, Ser. No. 08/885,095, are herein incorporated by reference, describes apparatus for generating uniform magnetic fields in a region of interest employing wedge-shaped blocks as the primary generator of the main magnetic field. In that magnetic structure, there is no necessary relationship between the orientation of the magnetic field in a cavity defined by the wedge-shaped blocks and the block surfaces interfacing with the cavity. A major thrust of this application is how to generate a field that is sufficiently uniform for use in MRI by means of a relatively open magnetic structure allowing surgical intervention during an MRI procedure.

While the magnetic structures described in these referenced patents and applications are suitable for their intended purpose, nevertheless a possible shortcoming is the generation of a substantial fringe field in the medium surrounding the magnetic structure as a result of opening up the structure for surgical intervention. The fringe field can undesirably interfere with a surgeon's use within or adjacent the magnetic structure of various instruments and equipment which may be of ferromagnetic material and may be subject to magnetic field forces.

DEFINITION OF TERMS

A "high permeability" member means a soft ferromagnetic body having a permeability $\mu$ exceeding 10 and preferably as high as possible. In several of the referenced patents and publications, as well as in this application, it is sometimes referred to as a ($\mu=\infty$) material, in other words, an ideal soft ferromagnetic body. Practically speaking, the differences in function of a ($\mu=\infty$) material and a high permeability material are small. The behavior of infinite permeability ferromagnetic material can be approximated to a high degree of accuracy by soft iron as long as it is not magnetically saturated.

A "yoked magnetic system" means a permanent magnetic structure surrounded by a body of high permeability material—typically called a yoke—that functions to carry the return flux of the induction B from one pole of the magnetic structure to the other pole. To perform this function, typically the yoke requires a significant cross sectional area sufficient to convey the flux without saturating, and often has a varying cross section in accordance with the local flux-carrying requirement.

A "yokeless magnetic system" means a permanent magnetic structure in which the return flux of the induction B is carried by the magnetic material.

A "hybrid magnetic system" means a permanent magnetic structure which has the attributes of both a yoked and a yokeless magnetic system.

A "strap" means a high permeability member that functions to establish a unipotential or equipotential surface within or at the surface of a permanent magnet that may have inhomogenieties due to manufacturing tolerances and whose interior region or a surface thus deviates from what should have been an equipotential surface. In other words, the strap functions to create the equipotential condition that would have existed if the magnet were ideal with perfect materials and geometry. An external strap is somewhat equivalent to the yoke of a magnet, the basic difference between the yoke and the external strap being that the strap function is limited to closing the flux of the statistical fluctuation of the magnetic induction, i.e., to eliminate the components of the field parallel to the strap surface, while the yoke is designed to close the entire flux generated by the magnet. Since the strap only carries the flux of the statistical fluctuation of the magnetic induction, it requires only a small cross sectional area and typically is a very thin layer of uniform thickness. For a further description, reference is had to a copending application, Ser. No. 08/613,756, filed Feb. 26, 1996, and our paper entitled "Strapping Techniques For Permanent Magnets, IEE Transactions On Magnetics, 32/5, September 1996, Pgs. 5082–5084, whose contents are herein incorporated by reference.

"Unipolar magnetic structure" is used herein in the sense that a single magnetic pole piece of a magnetic structure functions as a platform adjacent a cavity for receiving an object to be analyzed, the single magnetic pole generating flux in the cavity, whereas the magnetic structure, rather than a second distinct pole piece, collects that magnetic flux. In a unipolar magnetic structure, there typically will not exist a single magnetic element that can perform the function of a second magnetic pole piece.

A "uniform magnetic field" means a magnetic field that over a region of interest has an intensity that varies by less than 100 ppm.

SUMMARY OF INVENTION

A principal object of the invention is a magnetic structure for generating a uniform magnetic field in a region of interest, the magnetic structure employing blocks of permanent magnetic material to generate the main magnetic field.

Another object of the invention is a magnetic structure comprising permanent magnetic material blocks for generating a uniform magnetic field in a cavity containing a region of interest, with the cavity being open to the surrounding medium to allow access to the region of interest.

Still another object of the invention is a magnetic structure for generating a uniform magnetic field in a cavity containing a region of interest, with the cavity being open to the surrounding medium, and in which a relatively small fringe field is generated by the magnetic structure in the surrounding medium via the cavity opening.

Still a further object of the invention is a magnetic structure for generating a uniform magnetic field in a cavity containing a region of interest, with the cavity being sized to accommodate at least a part of a human body for MRI, and with the cavity being open to allow surgical intervention from a surrounding medium to the body part, resulting in a minimum fringe field in the surrounding medium.

These and other objects are achieved in accordance with one aspect of the invention by a magnetic structure for generating a uniform magnetic field using permanently magnetized blocks of magnetic material as the principal generator of the magnetic field in a desired region of interest within a cavity of the structure. In a preferred embodiment of the invention, the cavity interfaces on one side with a plane surface of a high permeability material on the surface of one of the blocks and which serves as a platform for supporting an object to be analyzed in a region of interest adjacent the platform. The magnetic structure is configured as a unipolar magnetic structure with the high permeability material functioning as the single magnetic pole piece of the magnetic structure, and with the magnetic structure functioning to collect the magnetic flux flowing through the single pole piece and through the cavity.

In accordance with another aspect of the invention, the cavity at another side is open to the surrounding medium to allow access to the object from the surrounding medium, as, for example, by a surgeon who wishes to conduct a medical procedure on the subject while the subject is undergoing MRI. The cavity at its open side interfaces with the surrounding medium. In another preferred embodiment of the invention, the magnetic structure is configured to form at the location of the interface with the surrounding medium, before opening of the cavity, an equipotential surface. This represents the equivalent of a high permeability membrane being present at the interface and thus closing off the cavity. After the cavity is actually opened, with the result that the cavity opening does not interface with a magnetic element, it is found that the opening generates only a minor perturbation in the region of interest.

In accordance with still another preferred embodiment of the invention, the opening providing access to the cavity from the surrounding medium is located in the direction of the magnetic field.

Among the important benefits of a magnetic structure according to the invention is that, not only is a uniform magnetic field in a substantially-sized region of interest obtained capable of supporting MRI of a patient, and not only is reasonable access by a surgeon provided to the patient when within the region of interest, but in addition a relatively small fringe field via the open cavity side is produced by the magnetic structure in the surrounding medium.

Magnetic structures in accordance with the invention can be constructed as a yoked or a yokeless or a hybrid structure. In accordance with still another preferred embodiment of the invention, a hybrid structure open at the top is constructed on one side of a cavity as a yoked structure and on the opposite side of the cavity as a yokeless structure, with the yoked structure being substantially taller than that of the yokeless structure giving the resultant overall configuration a characteristic L-shape. This embodiment not only produces benefits of higher efficiency meaning that less magnetic material is required for a given field intensity, but in addition the L-shape improves the viewing and access angle for a surgeon into the cavity through the open top.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

DETAILED DESCRIPTION OF PREFERRED EMBODIMENTS

1. INTRODUCTION

An ideal open magnet for interventional procedures would be a horizontal platform that separates the region of interest from the magnet itself. The patient would be located above the platform with no obstacles and magnet components between the patient and the surgical team. However, several major problems make such a simple approach unsuitable for practical applications. In the first place, the high magnetic field uniformity required for imaging of the region of interest can be achieved only with platform dimensions so large as to be incompatible with the requirements of surgical procedures. A second major problem is the inability to confine the field within a small distance from the region of interest. The strong field needed in the region of interest for real time imaging during surgery could interfere with the instrumentation and electronic components located in the surgical suite. Furthermore, from the point of view of the magnet design, such a flat magnet is an extremely inefficient source of the field above the platform, requiring a massive magnetic structure that could hardly be integrated in existing surgical suites.

More conventional approaches, based on traditional C shaped or U shaped permanent magnets, severely limit the access to the region of interest. Even if these magnets are confined to the low field range (<0.3 T), the need to accept the full cross section of a human body results in massive and large structures.

The novel magnetic structures described in this application build on the new permanent magnet design methodology developed by us over the past few years and described in detail in the referenced papers, patents and applications. This design methodology and the availability of powerful rare-earth materials results in practical magnets capable of generating fields exceeding 0.5 T. The magnet structures described herein are examples of designs mainly for surgical applications based on the new methodology. The definition of the design approach and the selection of the basic geometries of the magnet structure are the subject of Sections 2–4. The effects of opening of the structure and the resultant magnetic structures are described in Section 5. Compensation for field distortions is discussed in Section 6. Structural modifications of the structure, dictated by practical design considerations, are discussed in Section 7. Some concluding remarks are given in Section 8.

2. L MAGNETS

Figure 1:
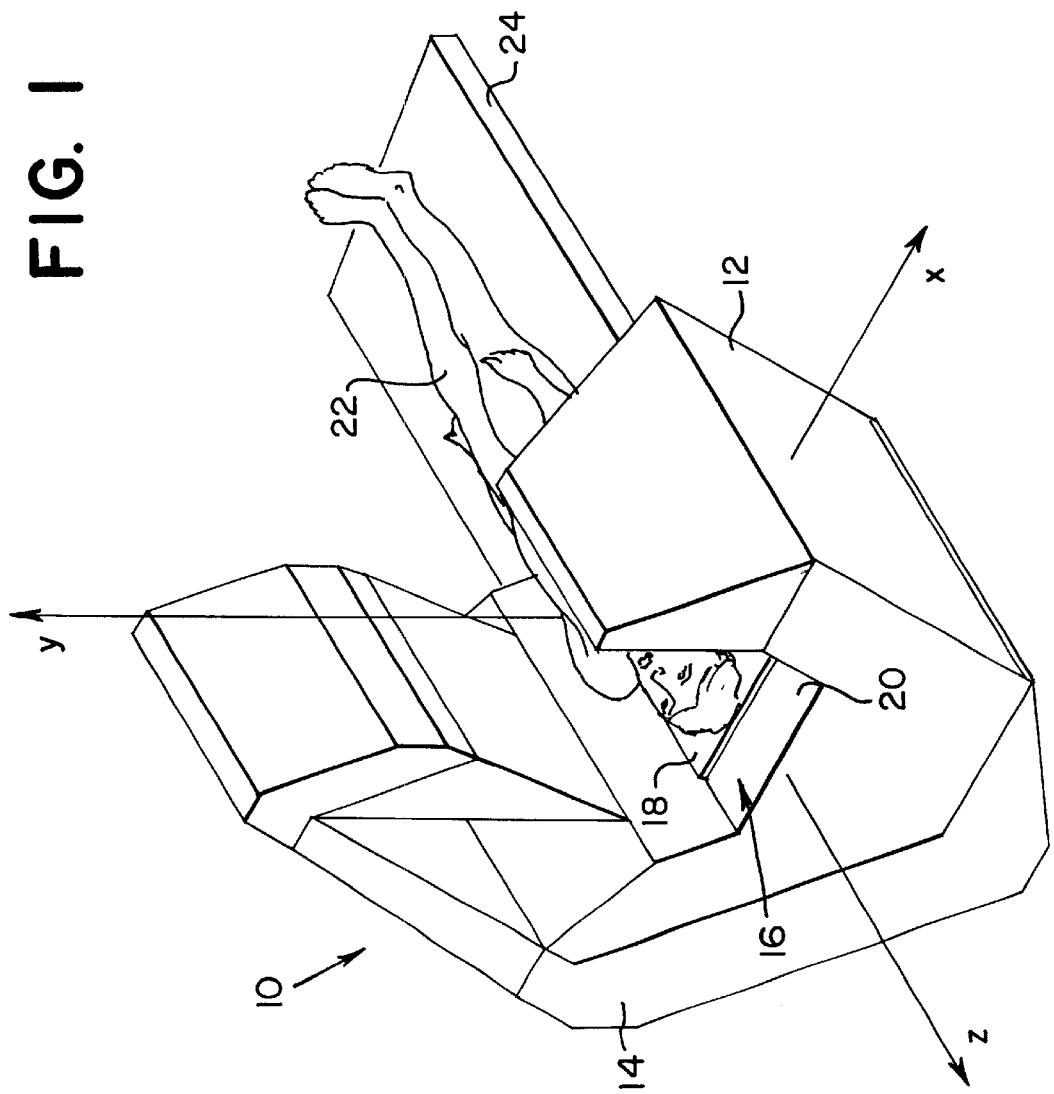
FIG. 1 is a perspective view of one form of hybrid magnetic structure in accordance with the invention.

To better understand the subject matter that follows below, which describes the evolution of the invention, reference is made to FIG. 1, which illustrates a preferred embodiment of the invention in three dimensions. The overall magnetic structure is designated 10, and comprises a shaded part 12 surrounded on its left side by a yoke 14. The shaded part 12 is made up of prism-shaped blocks of permanent magnet material, whereas the yoke 14 is constituted of a high permeability ferromagnetic material. A cavity 16 is provided within the structure which on its bottom side interfaces with a high permeability plate 18 which seats on the underlying surface 20 of the bottom block and which serves as a support platform for a patient 22 undergoing an MRI procedure. A non-magnetic support for the bottom part of the patient is shown schematically at 24. For convenience of description, the magnetic structure 10 is positioned within an arbitrary three-dimensional rectangular coordinate system consisting of perpendicular x, y, and z axes to define a polygonal cavity 16 having one side open at the top for accessing the patient when placed in the cavity. The long direction of the cavity extends in the z direction, sometimes referred to as its axis, the width of the cavity extends in the x direction, and the height of the cavity extends in the y direction. The magnetic field within the cavity is generally parallel to the y axis, and the region of interest would be a generally enclosed region adjacent the high permeability plate 18 of approximately the size of an average adult. (FIG. 1 is not drawn to scale with respect to the dimensions of the body of the patient relative to the magnetic structure.) The left side of the magnetic structure 10 is higher than that of the right side which is characteristic of an L-shaped embodiment of the invention.

Figure 2:
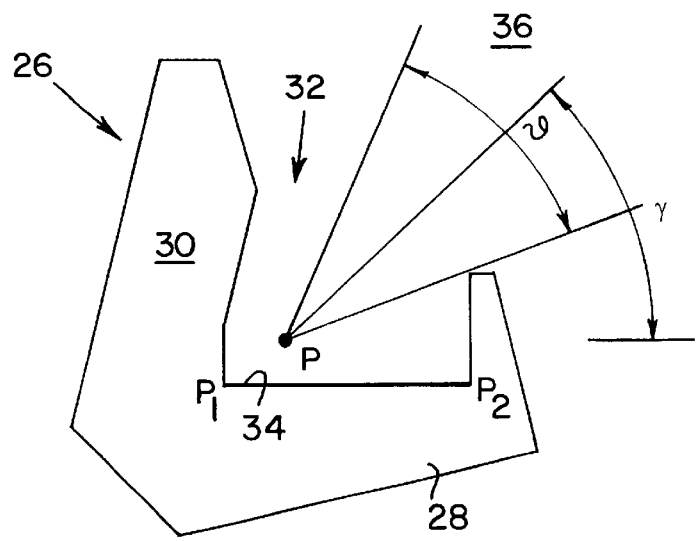
FIG. 2 is a conceptual schematic of one form of L magnet embodiment in accordance with the invention.

FIG. 2 defines the conceptual schematic of one form of magnetic structure 26 in accordance with the present invention. The L-shaped two-dimensional geometry of FIG. 2 is intended to generate a vertical uniform field in a region close to the horizontal side 28 of the L, which is assumed to support the body under scrutiny in a way similar to the arrangement of a flat platform magnet. The vertical side 30 on the left of the L geometry acts like a magnetic mirror of the field, thereby making the L shaped structure equivalent to a wider flat platform magnet. The L structure may be designed to generate a uniform field in a region close to the corner $P_1$ of the L, extending over a distance from the corner small compared to the L dimensions. To extend the region of uniform field over a substantial fraction of the horizontal side $(P_1, P_2)$ of the L, the L is terminated at $P_2$ with a magnetic structure that creates a widely open cavity 32 as shown in FIG. 2. An essential part of the design is to generate a geometry of the termination that makes it possible to access a point P of the imaging region along a prescribed direction γ over a wide angle θ as indicated in FIG. 2.

To maintain the field uniformity at point P close to the horizontal side 28 of the L, it is necessary to compensate for the magnetization tolerances of the magnetic material located below side $(P_1, P_2)$. This is accomplished by inserting a high magnetic permeability plate 34 at the interface between cavity and magnetic material, as indicated by the heavy line in FIG. 2. (In many of the figures of this application, as is common in the magnetic literature, thick or heavier lines are used to designate high permeability members, which may be yokes or straps or a high permeability plate as indicated at 34.) As a consequence, the magnetic structure of the L magnet is designed to generate a field perpendicular to side $(P_1, P_2)$, that then becomes equivalent to a pole piece of a traditional magnet. Hence, a single pole piece represented by the high permeability plate 34 characterizes this L magnet embodiment, where the return of flux emerging from the pole piece 34 into the cavity 32 is distributed over the rest of the L structure. The orientation of the field above the single pole piece 34 makes it possible to reduce the fringe field generated in the medium 36 surrounding the L magnet to the field of a quadrupole which results in the confinement of the fringe field within a small distance from the magnet itself. It will be noted that the cavity opening 32 is located opposite to the high permeability member 34 and in the direction of the field.

The basic concept of the invention is to configure the magnetic structure as if a hypothetical high permeability membrane closed off the opening and thus an equipotential surface existed at the membrane, and then to remove the hypothetical membrane. We have found that, under these circumstances, the resultant magnetic structure with the opening will still generate a magnetic field of sufficient uniformity within the region of interest to make possible MRI of a patient while allowing access to the patient.

The conceptual design approach of the L magnet will be better understood with the background of our recent paper devoted to the analysis of open permanent magnets, "Linear Theory of Pole Piece Design in Permanent Magnets", Proceedings of the Thirteenth International Workshop on Rare-Earth Magnets and their Applications, Birmingham, U.K., September 1994. Two basic structures can be chosen: a yokeless structure where the flux is closed through the magnetic material and a yoked structure where the flux is closed through an external ferromagnetic yoke. The yoked structure uses less magnetic material than the yokeless structure, but it results in larger magnet dimensions because of the amount of ferromagnetic material required to close the flux of a high field magnet. A third structure suitable for the design of the L magnet is a hybrid structure that combines the advantages of both yoked and yokeless magnets.

3. YOKED STRUCTURES

Following the design methodology described in the referenced patents and publications,—which should also include a book authored by M. G. Abele entitled "Structures Of Permanent Magnets", published by John Wiley and Sons, New York, 1993, especially pgs. 163–171—that starts with a closed cavity, the design of the L magnet evolves from the analysis of candidate magnetic structures capable of generating a uniform field in a cavity of assigned geometry. The structure is designed to generate the maximum field within practical limits of weight and dimensions of the magnet.

Figure 3:
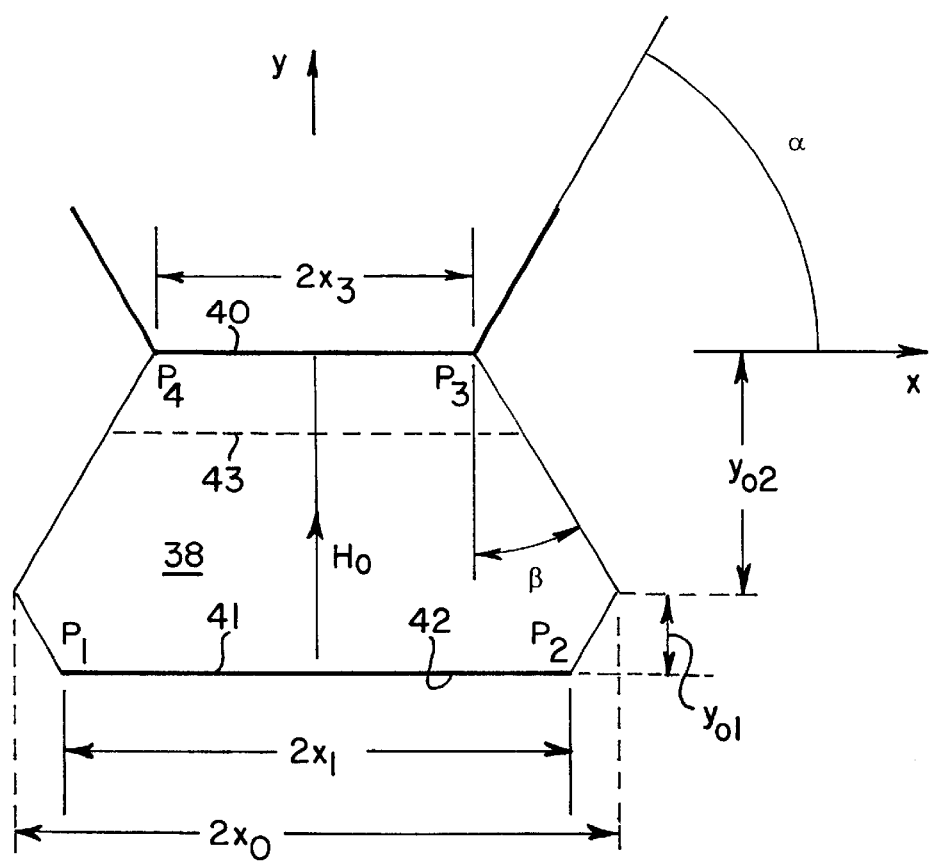
FIG. 3 is a schematic cross section of a closed two dimensional cavity.

Consider the polygonal cross section of a two-dimensional prismatic cavity 38, enclosed by a structure of magnetic material consisting of uniformly magnetized prisms, the shaded bodies, as shown in FIG. 3. The structure shown in the schematic of FIG. 3 is designed to generate a uniform intensity $H_0$ of the magnetic field oriented along the axis y. The structure is enclosed by a ferromagnetic medium, such as a yoke (not shown), designed to close the flux of the magnetic induction B generated by the material. Ideally the medium of the external yoke is assumed to have a magnetic permeability $\mu=\infty$.

The selection of the geometry of the cavity has to be consistent with the imaging requirements, and the cavity must accept the full body of the patient with its axis parallel to the axis of the prismatic cavity. If the imaging region is assumed to be as close as possible to the lower horizontal side of the polygon 42, the dimension $2x_1$ of the lower side $(P_1, P_2)$ must be large enough to accept the maximum transverse dimension of the human body. The upper side of the polygon, shown closed off by a high permeability membrane 40, is intended to be partially open to access the patient during the scanning procedure.

The design starts assuming first the closed geometry as shown in FIG. 3. Once the geometry of cavity has been selected, the computation of the closed magnetic structure is based on a number of design parameters. Assume that a magnetic material characterized by a linear demagnetization characteristic with zero magnetic susceptibility and remanence $J_0$ is chosen for the magnetic structure. The magnitude $H_0$ of the uniform intensity $H_0$ is related to $J_0$ by the equation $$\mu_0 H_0 = K J_0, \tag{1}$$

where $\mu_0$ is the magnetic permeability of a vacuum, and K is a nondimensional design parameter that satisfies the condition $$0 < K < 1 \tag{2}$$

in a single layer magnet.

The second design parameter is the orientation of the field. Because of its proximity to the imaging region, the magnetization and fabrication tolerances of the magnetic material that interfaces with the cavity through side $(P_1, P_2)$ should be far better than what can be achieved with available magnetic materials. To filter out these tolerances, the design includes a high magnetic permeability plate 41 inserted on the surface $(P_1, P_2)$ as schematically indicated by the heavy line in FIG. 3. As a consequence the intensity $H_0$ within the cavity should be oriented perpendicular to the interface $(P_1, P_2)$.

With the field $H_0$ oriented in the direction of the arrow shown in FIG. 3, the computation of the geometry of the magnetic structure that encloses the cavity, requires the selection of a reference equipotential surface inside the cavity. By definition, the reference equipotential surface, indicated by the dashed line 43 in FIG. 3, is the surface whose potential is assumed to coincide with the potential of the external medium where the magnet is located. By definition the reference potential is assumed to be $$\Phi=0. \tag{3}$$

Assume that the reference equipotential surface coincides with the upper side ($P_3$, $P_4$) of the cavity, which is chosen to be parallel to the lower side ($P_1$, $P_2$). Then the upper side of the cavity becomes part of the external $\Phi=0$ surface of the yoke that encloses the magnet.

Figure 3A:
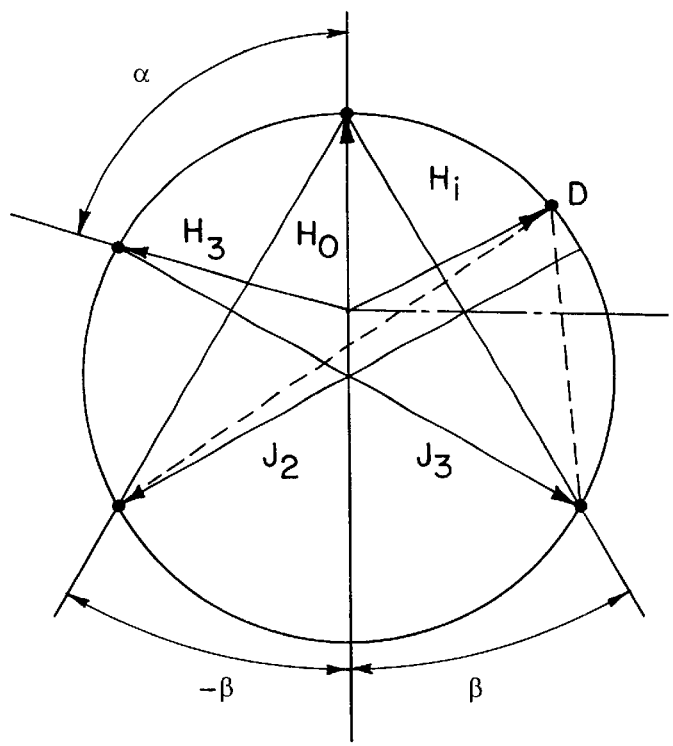
FIG. 3A illustrates a vector diagram for computation of the geometry of the yoked magnet of FIG. 3B.
Figure 3B:
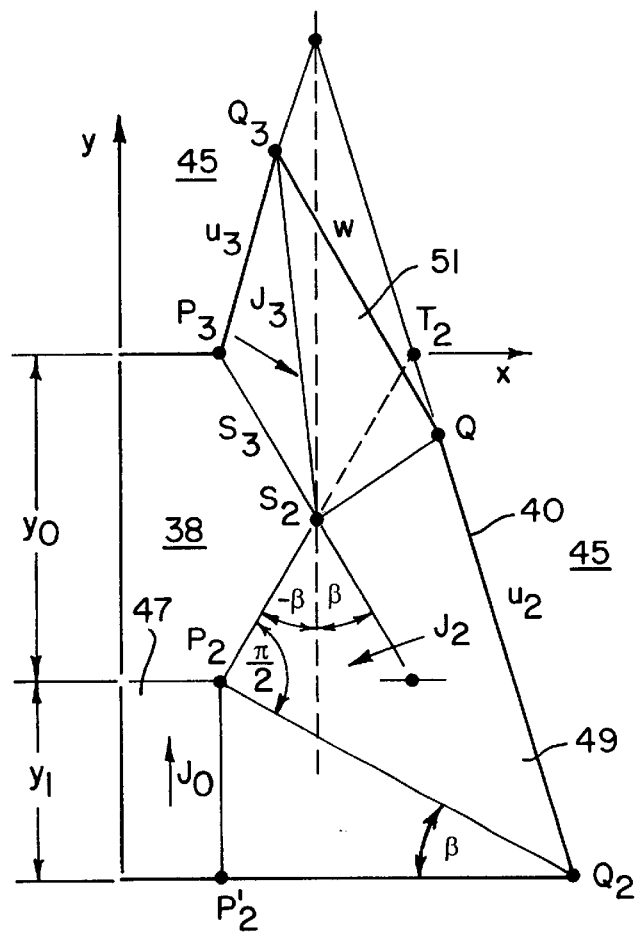

Assume an ideal structure where the external ferromagnetic yoke (not shown in FIG. 3, but referenced 40 in FIG. 3B) is characterized by a magnetic permeability $\mu=\infty$. In this limit the yoke reduces to a surface that separates the prismatic structure of magnetic material from the outside medium 45. Assume that the sides of the yoke that emerge from ($P_3$, $P_4$) are oriented at an angle $\alpha$ relative to the x-axis as indicated in FIG. 3. The intensity H in the magnetic material bound by the yoke must be perpendicular to the yoke surface. With the selected value of the parameter K given by Eq. (1), the vector diagram of FIG. 3A provides the orientation of the remanence $J_3$ in the prism of magnetic material confined by side $u_3$ of the yoke 40 (FIG. 3B). The orientation of the remanence $J_3$ determines the orientation of the side $s_3$ of the cavity that has point $P_3$ in common with the $\Phi=0$ line.

Once side $s_3$ and a symmetric side $s_4$ (not shown) have been selected, and the full geometry of the cavity has been chosen, the computation of the magnetic structure proceeds following the design approach of a yoked magnet. Assume for instance an hexagonal contour of the cavity, where side ($P_2$, $S_2$) is oriented at the angle $-\beta$ relative to the y axis as shown in FIG. 3A where the dimensions $2x_1$, $2x_3$ (see FIG. 3B) of sides ($P_1$, $P_2$), ($P_3$, $P_4$) are arbitrarily chosen equal to each other. Side ($P_1$, $P_2$) is the interface between the cavity 42 and a rectangular cross section prism 47 (FIG. 3B) magnetized in the direction of the axis y. The $y_1$ dimension of the prism is related to the height $y_0$ of the cavity by the equation $$y_1 = \frac{K}{1-K} y_0 \tag{4}$$

The prism 49 of magnetic material that interfaces with the cavity through side ($P_2$, $S_2$) is magnetized with a remanence $J_2$ computed with the vector diagram of FIG. 3A. Side ($P_2$, $Q_2$) is perpendicular to side ($P_2$, $S_2$), and a triangular region ($P_2$, $P'_2$, $Q_2$) of nonmagnetic material separates the two prisms 47, 49 of remanences $J_0$ and $J_2$.

The external boundary $u_2$ of the region of remanence $J_2$ is computed by determining first the position of point $T_2$ where the straight line that contains points $P_2$, $S_2$ intersects the axis x, as shown in FIG. 3B. The external boundary $u_2$ belongs to the straight line that contains points $Q_2$, $T_2$.

The two prisms of remanence $J_2$, $J_3$ cannot have a common interface and must be separated from each other by a second region 51 of nonmagnetic material, as shown in FIG. 3B. The geometry of such a region is determined by selecting a point D on the circle of the vector diagram of FIG. 3A. The lines (D, $N_2$), (D, $N_3$) determine the orientation of the interfaces of the non-magnetic region 51 and regions of remanence $J_2$ and $J_3$, respectively. Vector $H_i$ is the intensity in the non-magnetic region, and is perpendicular to the side of the yoke w. One way of selecting point D in the vector diagram is to choose the length of side ($P_3$, $Q_3$) of the external boundary of the region of remanence $J_3$. Thus the orientation of interface ($S_2$, $Q_3$) is determined and point D is the intersection of the line parallel to ($S_2$, $Q_3$) drawn from the tip of vector $J_3$ in the diagram of FIG. 3A.

As an example of a yoked design with a hexagonal cavity, assume a target field $$B_0 \geq 0.5 \text{ T}. \tag{5}$$

Field level (5) is compatible with structures of rare-earth materials operating close to the optimum point of the demagnetization characteristics. Typical rare earth materials are of a rare earth alloy such as Nd.Fe.B with a remanence of about 1.0–1.4 T. Select the value of the basic design parameter K $$K = B_0/J_0 = 0.5, \tag{6}$$

where $J_0$ is the remanence of the material. Assuming a value $J_0 \approx 1.3$ T, the nominal field level in the closed cavity would be $B_0 \approx 0.65$ T. This design starts by assuming a two dimensional closed cavity 38 with the hexagonal cross section as shown in FIG. 3. The angles of the hexagon in this case are all equal to $2\pi/3$, so that sides ($P_1$,$P_2$) and ($P_3$,$P_4$) are parallel to each other. In this example, the horizontal dimension of the cavity is fixed at $$2x_0 = 70 \text{ cm} \tag{7}$$

and the vertical dimensions $y_{01}, y_{02}$ are determined by the field uniformity requirements. The intensity $H_0$ of the magnetic field within the cavity is assumed perpendicular to sides ($P_1$, $P_2$), ($P_3$,$P_4$).

Figure 4:
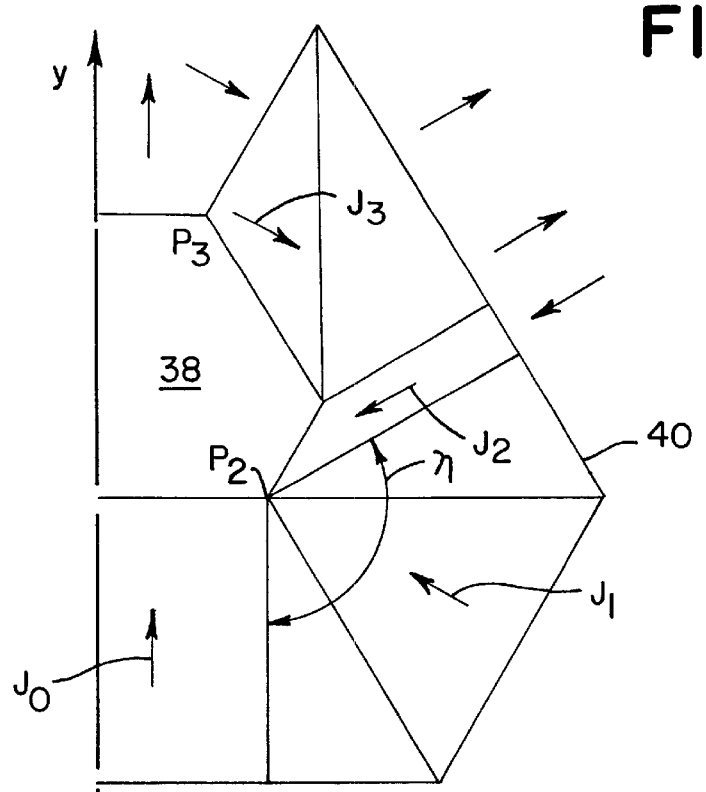
FIGS. 4 and 4A illustrate the geometry of modified yoked magnetic structures in the course of the development of suitable magnetic structures in accordance with the invention.

With a yoked magnetic structure capable of generating the field (6), the geometry of the structure depends on the position of the equipotential reference surface $\Phi=0$ within the cavity. See, for example, Abele M G., "Generation of Highly Uniform Field with Permanent Magnets" (Invited), J Appl Physics 76(10), 6247–6252, 1994. Assume that the $\Phi=0$ surface coincides with side ($P_3$,$P_4$) of the cavity. The geometry of one such magnetic structures is shown in FIG. 4. As with some of the previous drawings, just the right half is shown as the left half is a mirror image of the right half. The permanent magnet blocks are shown shaded, the heavy line 40 represents the external yoke, and the arrows inside the blocks represent the orientation of their respective remanences $J_0$. The computation of the geometry and distribution of magnetization in the components of the structures of FIG. 4 can be provided by a vector diagram as before. By virtue of condition (6) the value of the induction B and intensity H in each component of the magnetic structure of FIG. 4 is $$B_h = -\mu_0 H_h = \frac{1}{2} J_h, (h=0,1,2,3). \tag{8}$$

FIG. 4 corresponds to cavity dimensions $$y_2 = 2y_1 = \frac{\sqrt{3}}{2} x_0. \tag{9}$$

In FIG. 4, the flux of B in the component of remanence $J_1$ closes through the external yoke 40 within the angular sector $\theta=2\pi/3$ without circulating through the cavity 38. This affects the figure of merit M of the FIG. 4 geometry, that, for the dimensions (9) is $$M=0.097 \tag{10}$$

Figure 4A:
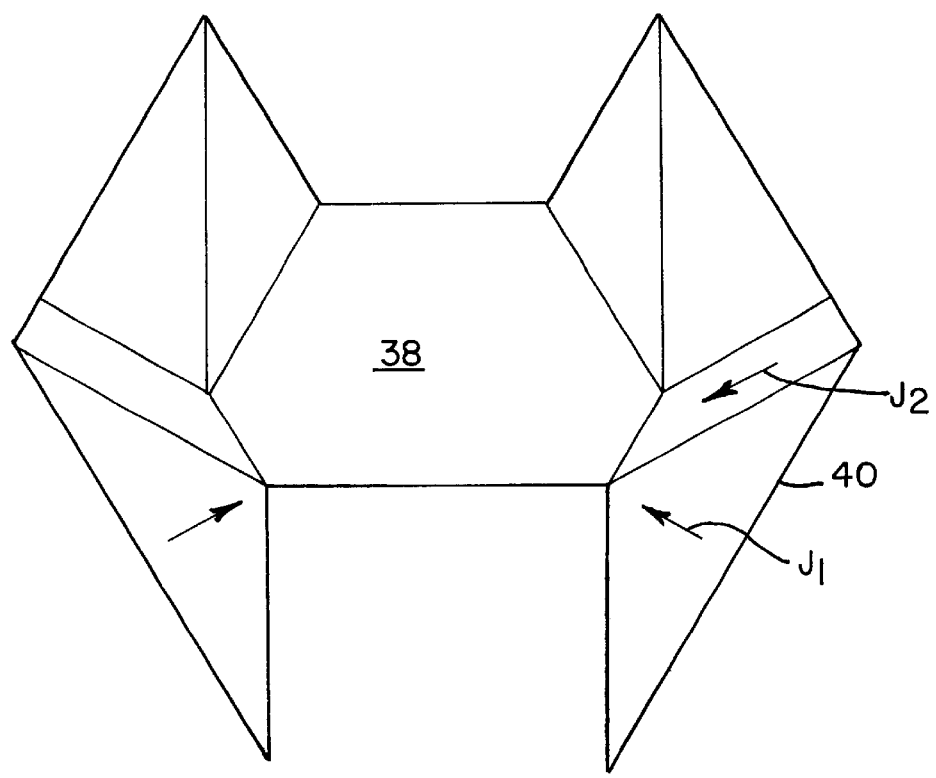

The flux of B that circulates in the component of remanence $J_1$ (FIG. 4) can be eliminated by modifying the magnetic structure, as shown in FIG. 4A. The amount of magnetic material is reduced by the modification which results in the increased figure of merit $$M=0.106 \tag{11}$$

and in smaller magnet dimensions.

The external dimensions of the magnetic structure example of FIG. 4 are $$2x_e \approx 1.33 \text{ m}, y_e \approx 1.21 \text{ m} \tag{12}$$

and the weight of the magnetic material per unit length of the magnet in the z-direction is $$W \approx 4.42 \text{ T/m}. \tag{13}$$

Figure 5:
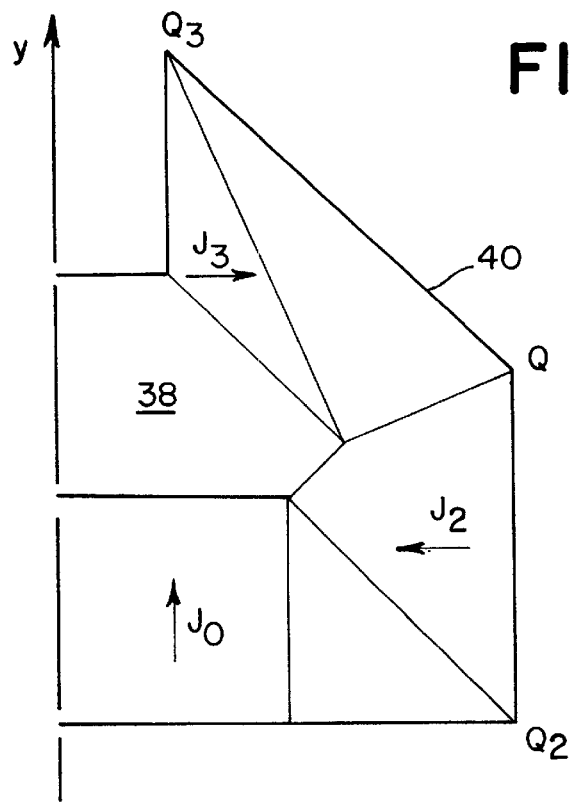
FIG. 5 shows a modified geometry of a yoked magnet.
Figure 5A:
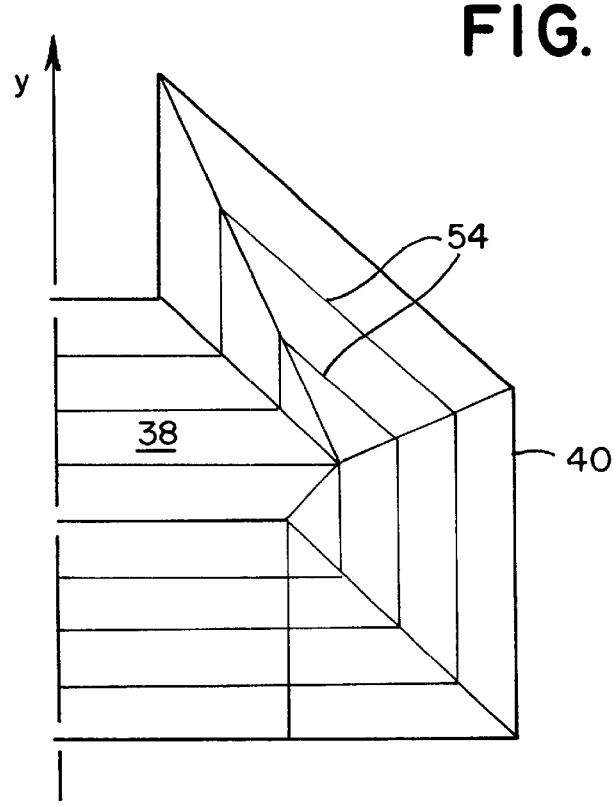
FIG. 5A shows the equipotential surfaces in the magnetic structure of FIG. 5.

As a further example of a yoked design, consider the case $$K=0.5, \alpha=\pi/2 \tag{14}$$

and assume a length ($P_2$, $Q_3$) equal to the height $y_0$ of the cavity. A vector diagram (not shown), derived in the same way as described above, provides the orientation of the remanences and the position of point D consistent with the selected length ($P_2$, $Q_3$). One such magnetic structure is shown in FIG. 5, and is an example of a yoked geometry with a hexagonal cavity 38 that corresponds to an arbitrary selection of $x_3 \neq x_1$, and a boundary (Q, $Q_2$) of the medium of remanence $J_2$, parallel to the axis y. The equipotential surfaces 54 in the structure of FIG. 5 are shown in FIG. 5A.

Figure 6:
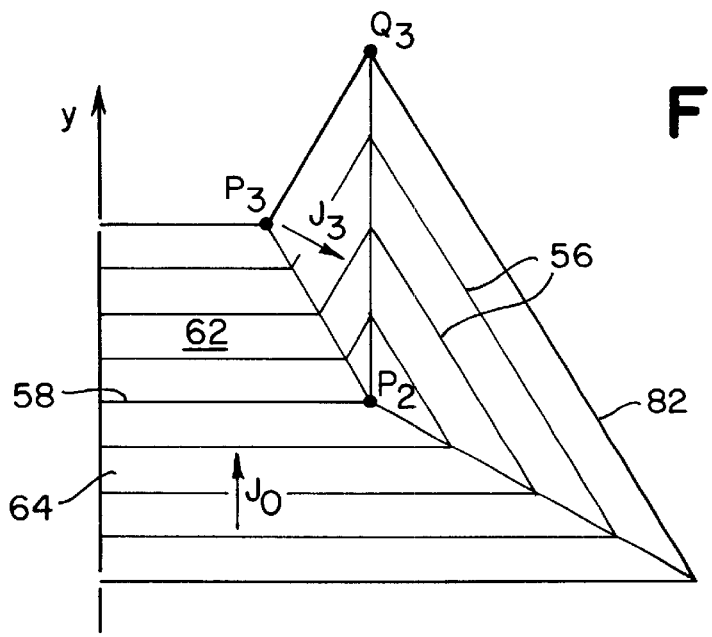
FIG. 6 shows the equipotential surfaces of a modified form of yoked magnetic structure with a trapezoidal cavity.

Still another example of the structure of FIG. 3B but with a trapezoidal cavity is the geometry shown in FIG. 6. The trapezoidal cavity results from the elimination of the side ($P_2$, $S_2$). The geometry of FIG. 6 corresponds to the value of K $$K=0.5. \tag{15}$$

Figure 6A:
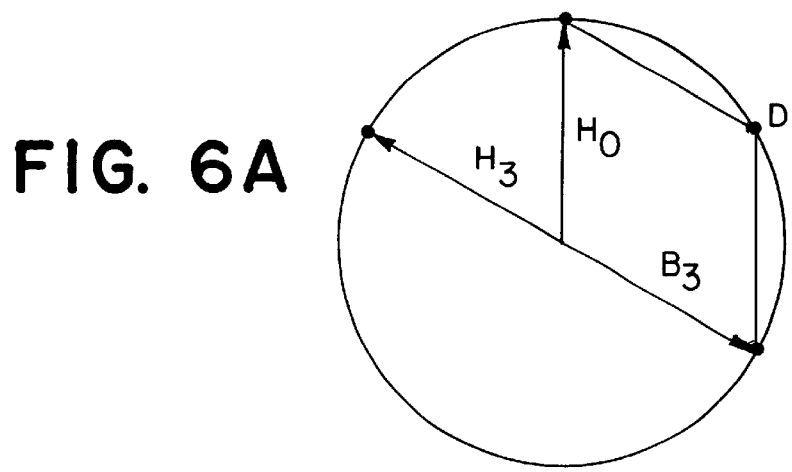
FIG. 6A illustrates a vector diagram for computation of the geometry of the yoked magnet shown in FIG. 6.

An angle $\alpha=60°$ is selected for the orientation of side ($P_3$, $Q_3$) and the vector diagram of FIG. 6A provides the geometry of the magnetic structure. The position of point D on the circle of FIG. 6A is selected to provide an interface ($P_2$, $Q_3$) parallel to the axis y.

Figure 6B:
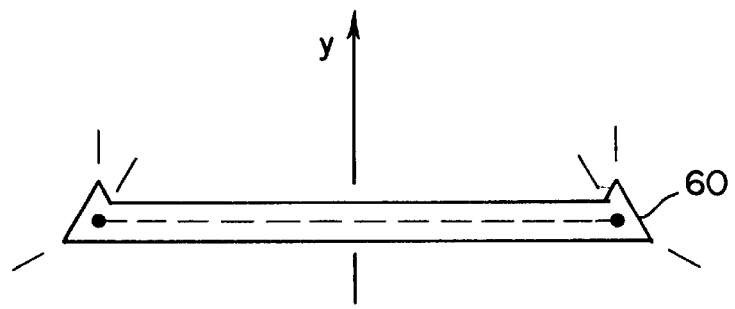
FIG. 6B shows the geometry of a high permeability pole piece suitable for use in magnetic structures in accordance with the invention.

FIG. 6 shows the equipotential surfaces 56. Each closed equipotential surface can be transformed into the surface of a $\mu=\infty$ ferromagnetic body without perturbing the field configuration. Thus one 58 of the equipotential surfaces may become the surface of a pole piece 60 shown in FIG. 6B inserted between the cavity 62 and the main prism 64 of magnetic material, as discussed above and in some detail in the following section.

Figure 6C:
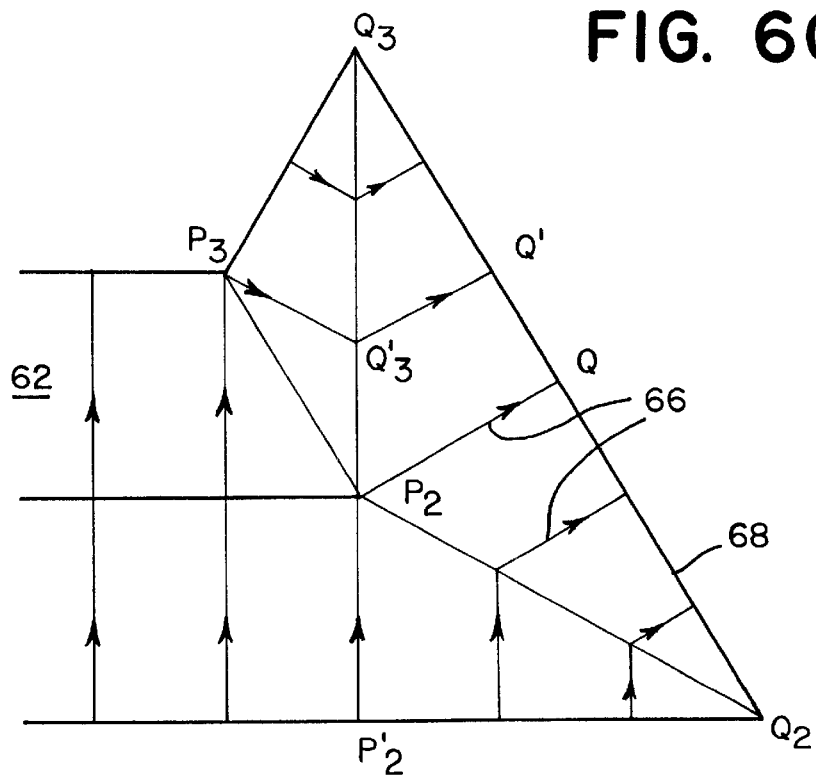
FIG. 6C shows the flux of the magnetic induction in the yoked magnet shown in FIG. 6.

FIG. 6C shows the orientation of the flux 66 of the magnetic induction in the components of the magnetic structure of FIG. 6. One observes the two regions ($P_2$, $P'_2$, $Q_2$, Q) and ($P_3$, $Q'_3$, Q', $Q_3$) where the flux closes between the magnetic structure and the external yoke 68 without circulating inside the cavity 62. This flux constitutes the fringe field that characterizes all yoked magnetic structures.

The structure shown in FIG. 6 is independent of the dimension $2x_3$ of the upper side ($P_3$, $P_4$) of the closed cavity (see FIG. 3). However, the dimension $2x_3$ affects the figure of merit M of the magnet, defined as $$M=K^2 A_c/A_m \tag{16}$$

where $A_c$, $A_m$ are the cross sectional areas of cavity and magnetic material respectively.

For K=0.5, the value of M of the structure of FIG. 6 is $$M = \frac{1}{4} \frac{x_3 + \frac{1}{2\sqrt{3}} y_0}{x_3 + \frac{7}{2\sqrt{3}} y_0}. \tag{17}$$

In the limit $x_3 \rightarrow \infty$, M attains the ideal maximum value $$M_\infty = \frac{1}{4}. \tag{18}$$

Figure 6D:
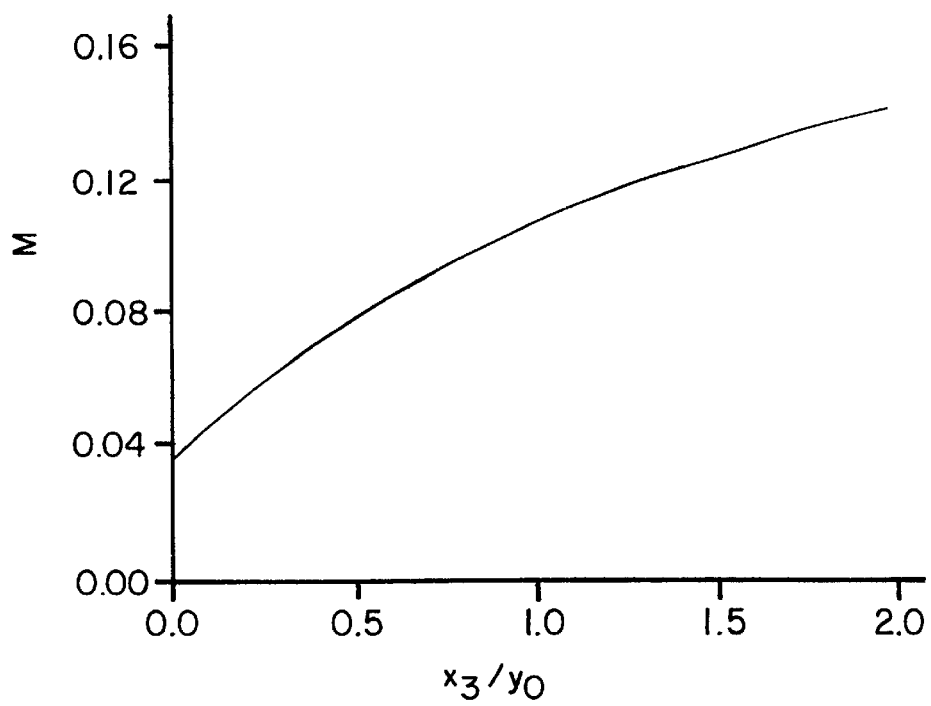
FIG. 6D is a graph plotting the figure of merit of the yoked magnet shown in FIG. 6 as a function of width of the cavity.

The value of M given by Eq. (18) is plotted versus $x_3$ in FIG. 6D. The low value of the figure of merit shown in FIG. 6D is the consequence of having selected the reference equipotential surface to coincide with one side of the cavity. This results in an amount of magnetic material larger than what would be needed to generate the same field within the same cavity with an optimum design approach.

4. YOKELESS STRUCTURES

Consider now a yokeless magnetic structure that encloses a two dimensional prismatic cavity and in particular consider the case of a structure designed for K=0.5 with the trapezoidal cavity introduced in FIG. 6. Again, the structure is designed with the assumption that the reference equipotential line $\Phi=0$ coincides with the side ($P_3$, $P_4$) of the cavity. The computation of the closed yokeless structure requires the selection of a characteristic point F on the $\Phi=0$ reference line that divides the total flux of B in the cavity in two independent paths within the magnetic material where the flux circulates in opposite directions, as described in the referenced book. Assume a symmetry condition where point F is located at the center of side ($P_3$, $P_4$). The magnetic structure is the combination of two layers of magnetic material: an internal layer that interfaces with the cavity where the distribution of the remanence is the same as in the case of the yoked structure, and an external layer that interfaces with an external medium where induction B and intensity H satisfy the condition $$B \cdot H = 0 \tag{19}$$

with H perpendicular to the external boundary.

Figure 7:
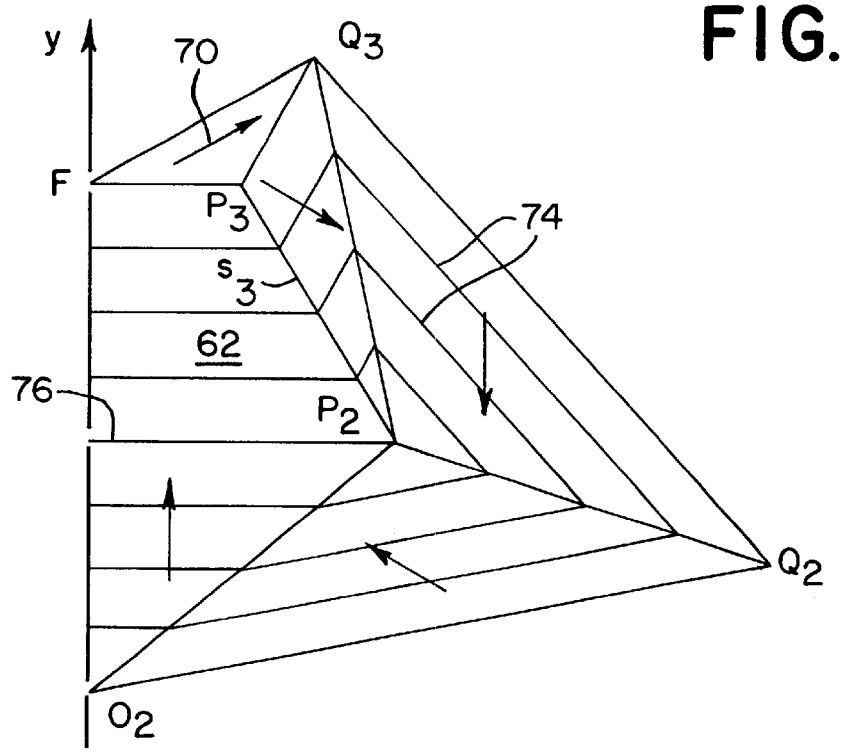
FIG. 7 illustrates one form of geometry of a yokeless magnet for K=0.5 in accordance with the invention.
Figure 7A:
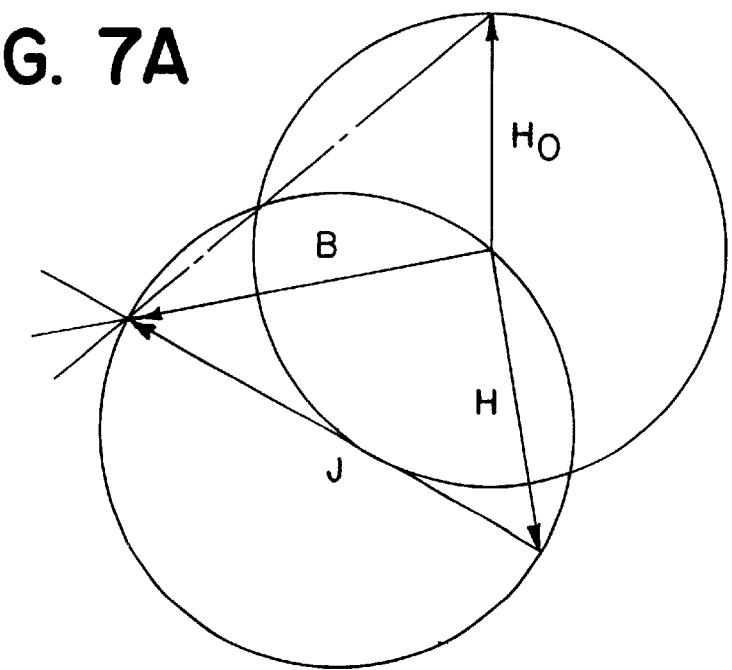
FIG. 7A illustrates a vector diagram for computation of the geometry of the yokeless magnet shown in FIG. 7.

FIG. 7 shows the cross section of one form of yokeless structure designed around the same cavity 62 of FIG. 6 for K=0.5 and $x_1=2x_3$. Shown in the figure are the orientations of the remanences in the magnetic components of the structure and the position of the characteristic point F at the center of the interface ($P_3$, $P_4$). The computation of the values of J, H, B in the triangular component ($O_2$, $Q_2$, $P_2$) is provided by the vector diagram of FIG. 7A. The external boundary of the ($O_2$, $Q_2$, $P_2$) component is tangent to a circle with center $P_2$ and radius $$r_2 = K l_2 \tag{20}$$

where $l_2$ is the distance between points F and $P_2$. Point $Q_3$ is located on the line perpendicular to side $s_3$ of the cavity, drawn from point F. Its distance from point F is $$w_3 = \frac{l_3}{1-K} \tag{21}$$

where $l_3$ is the distance of F from the straight line that passes through $P_2$, $P_3$. Thus, $w_3=2l_3$ for K=0.5. As shown in FIG. 7, the external boundary ($Q_2$, $Q_3$) is also tangent to the circle of radius $r_2$. The angle between the remanence of component ($P_2$, $Q_2$, $Q_3$) relative to side ($Q_2$, $Q_3$) is equal to the orientation of the remanence of component ($O_2$, $Q_2$, $P_2$) relative to ($O_2$, $Q_2$).

Figure 7B:
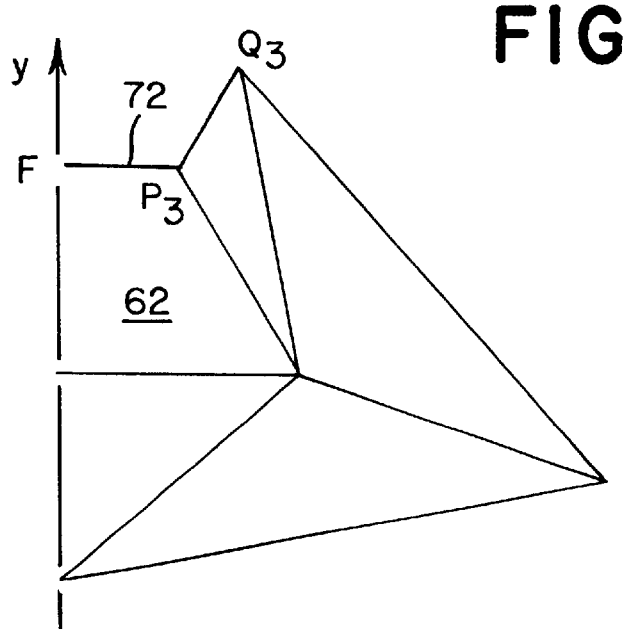
FIG. 7B illustrates how part of the FIG. 7 embodiment can be replaced with a partial high permeability yoke.

Triangle (F, $P_3$, $Q_3$) is an equipotential Φ=0 region and its remanence 70 is parallel to its external boundary (F, $Q_3$). Thus triangle (F, $P_3$, $Q_3$) can be eliminated if sides (F, $P_3$), ($P_3$, $Q_3$) are assumed to be layers of infinite magnetic permeability material, as indicated in FIG. 7B by the heavy line 72.

FIG. 7 also shows the equipotential lines 74. As in the case of the yoked structure, one 76 of the equipotential surfaces may become the surface of a pole piece, whose geometry is similar to the geometry of FIG. 6B.

The yokeless structure of FIG. 7 generates a uniform field as long as the magnetic material has a perfect demagnetization characteristic with zero magnetization and fabrication tolerances. A compensation of the effects of real material characteristics can be achieved with a strapping technique consisting of thin layers of high magnetic permeability material inserted in the magnet along the equipotential surfaces of the field generated by the ideal structure. The use of the strapping technique in the structure of FIG. 7 is illustrated in FIG. 7C, where one strap 78 follows the external boundary of the magnet and a second strap 80 is inserted on the $\phi_0/2$ equipotential surface where $\Phi_0$ is the potential of the ($P_1$, $P_2$) interface.

Figure 7C:
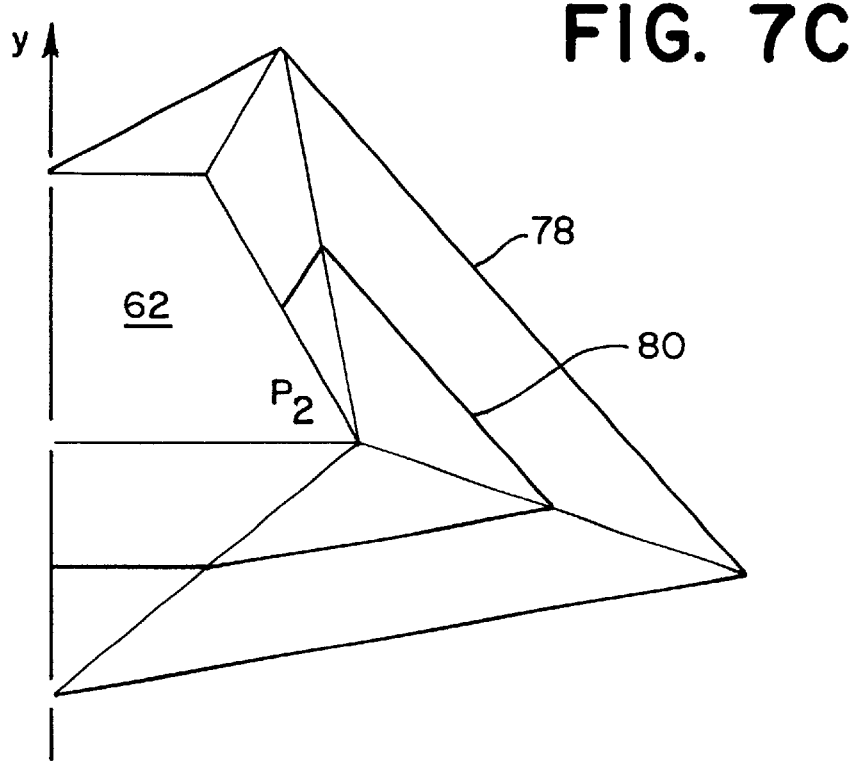
FIG. 7C illustrates how the structure of FIG. 7 can be improved by the addition of straps.

As explained earlier, the differences between the external strap 78 of FIG. 7C and the yoke 82 of FIG. 6 is that the strap closes only the flux of the field perturbation due to the tolerances rather than the total flux generated by the magnet.

The figure of merit of the yokeless magnet of FIG. 7 is $$M = 0.072, \tag{22}$$

which is significantly lower than the value M=0.082 of the yoked magnet given by Eq. (13) for $x_3 = y_0 \tan(\pi/6)$. As expected this is the result of closing the flux of the induction by means of magnetic material rather than an external ferromagnetic yoke.

Figure 8:
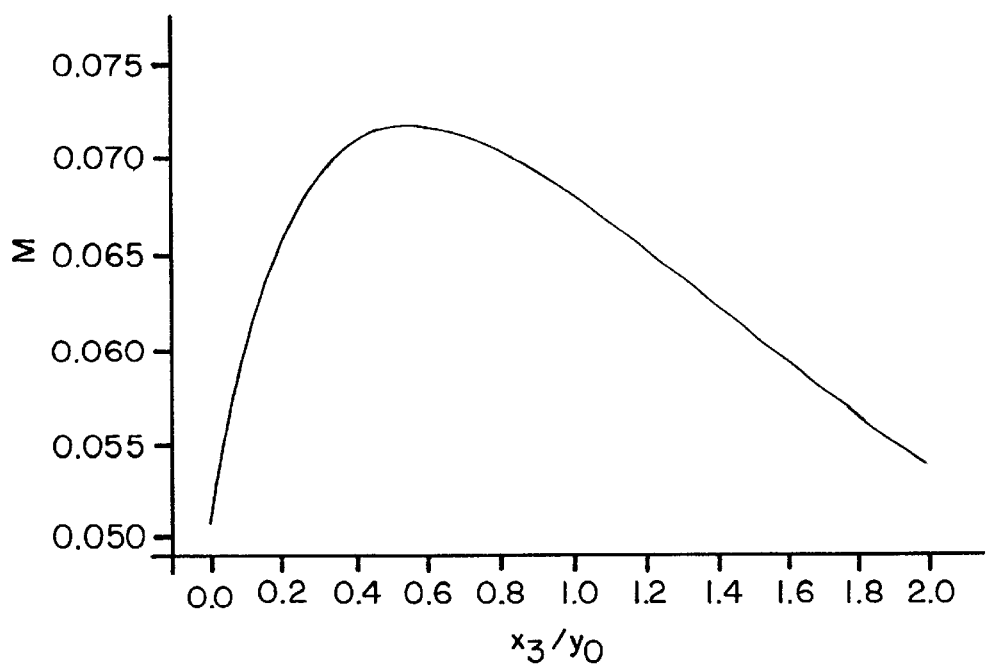
FIG. 8 is a graph plotting the figure of merit of the yokeless magnet shown in FIG. 7C as a function of width of the cavity.

The effect of a change of the ratio $x_3/x_1$ on the figure of merit is illustrated in FIG. 8 where M is plotted versus $x_3$ for K=0.5. The comparison of FIG. 8 with FIG. 6D shows the conceptual difference between the yokeless and yoked structures. The figure of merit of the yokeless magnet has a maximum at $x_3/y_0 \tan(\pi/6)$ and decreases for increasingly larger values of $x_3$, in contrast to the yoked magnet, where M increases to its maximum value (18) for $x_3 \to \infty$.

Figure 8A:
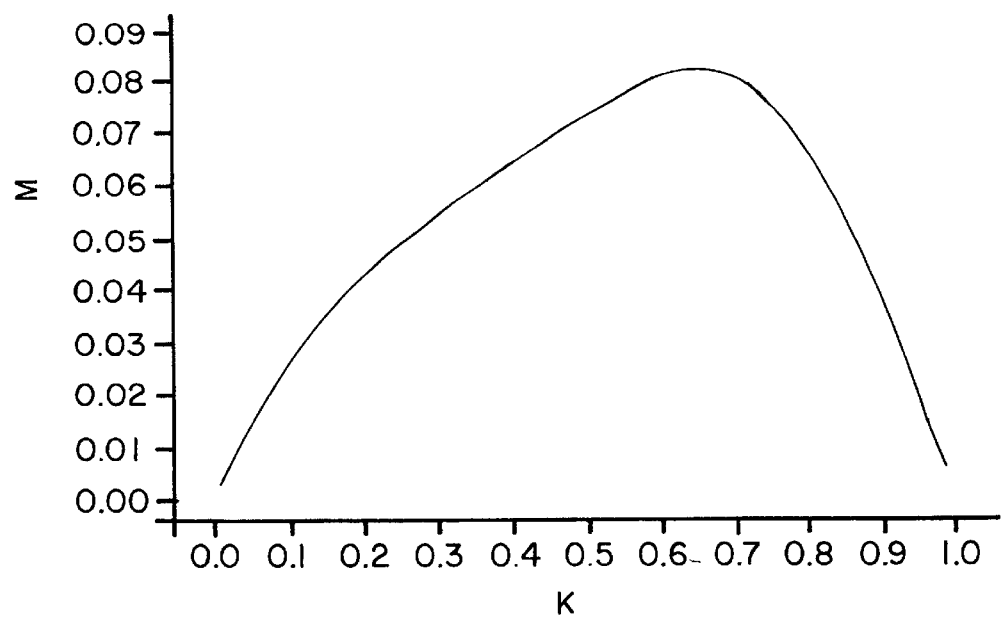
FIG. 8A is a graph plotting the figure of merit of the yokeless magnet shown in FIG. 7C as a function of K.

FIG. 8A presents the plotting of M versus K for $x_3/y_0 = \tan(\pi/6)$, which shows that the efficiency of the yokeless structure attains its optimum value for large values of K>0.5.

Figure 9:
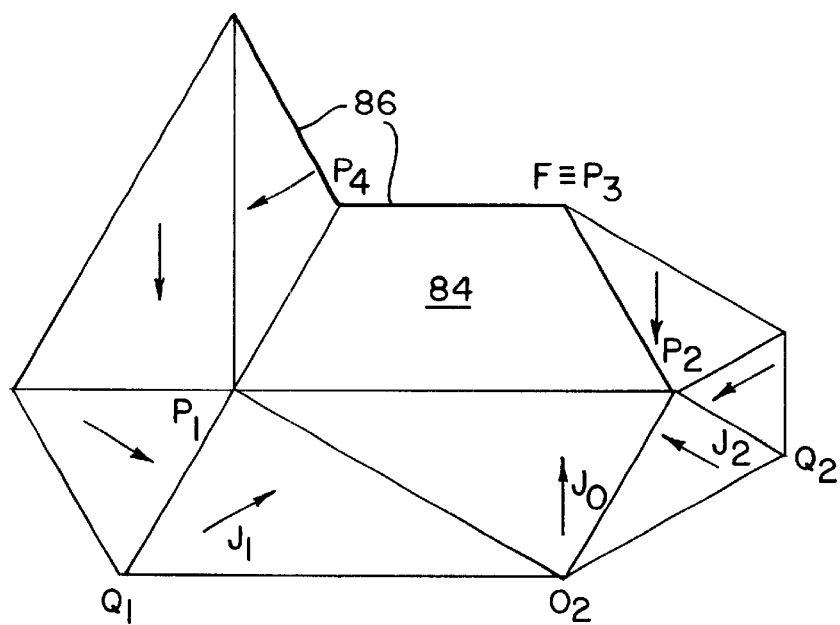
FIG. 9 illustrates one form of geometry of a yokeless magnet for K=0.5 in accordance with the invention.
Figure 9A:
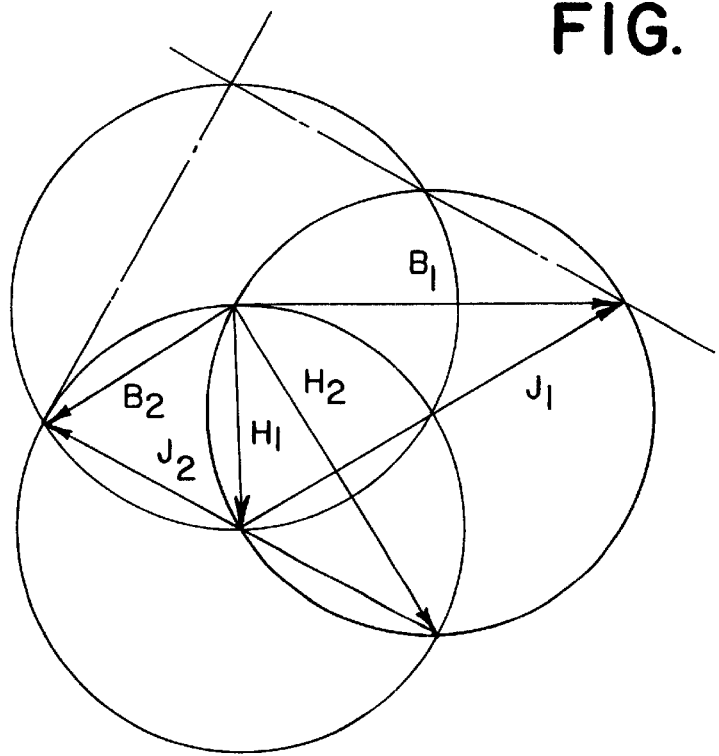
FIG. 9A illustrates a vector diagram for computation of the geometry of the yokeless magnet shown in FIG. 9.

In the previous yokeless structures discussed, the design was based on the characteristic point F being chosen at the center of the side ($P_3$, $P_4$) of the cavity. An important feature of the invention is the design change of moving the point F to coincide with the point $P_3$ of the cavity. Changing the position of the characteristic point F on the side ($P_3$, $P_4$) of the cavity results in a change of the magnet geometry. FIG. 9 shows the closed magnet cross section in the limit of point F located at the vertex $P_3$ of the cavity 84 for K=0.5. The distribution of vectors $J_2$, $H_2$, $B_2$ in the component ($P_2$, $O_2$, $Q_2$) and vectors $J_1$, $H_1$, $B_1$ in the component ($P_1$, $Q_1$, $O_2$) is given by the vector diagram of FIG. 9A. As before, the heavy line 86 closing off the cavity at the top represents the infinite permeability membrane assuring the desired equipotential surface at the interface to the surrounding medium.

Figure 10:
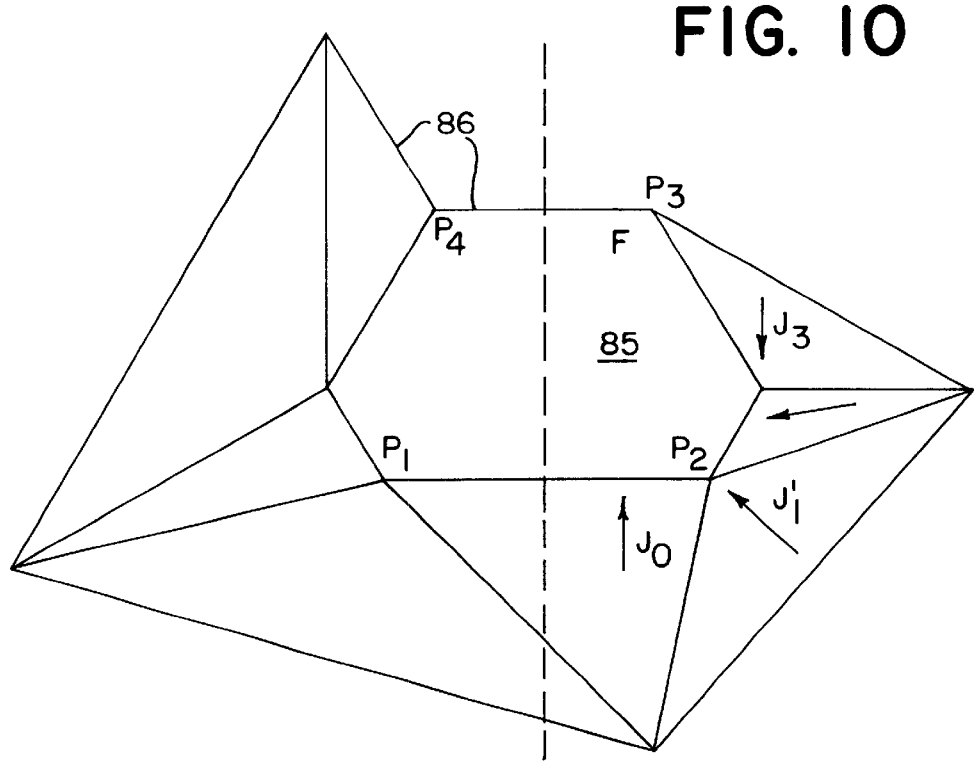
FIG. 10 illustrates another form of geometry of a yokeless magnet for K=0.5 in accordance with the invention.
Figure 10A:
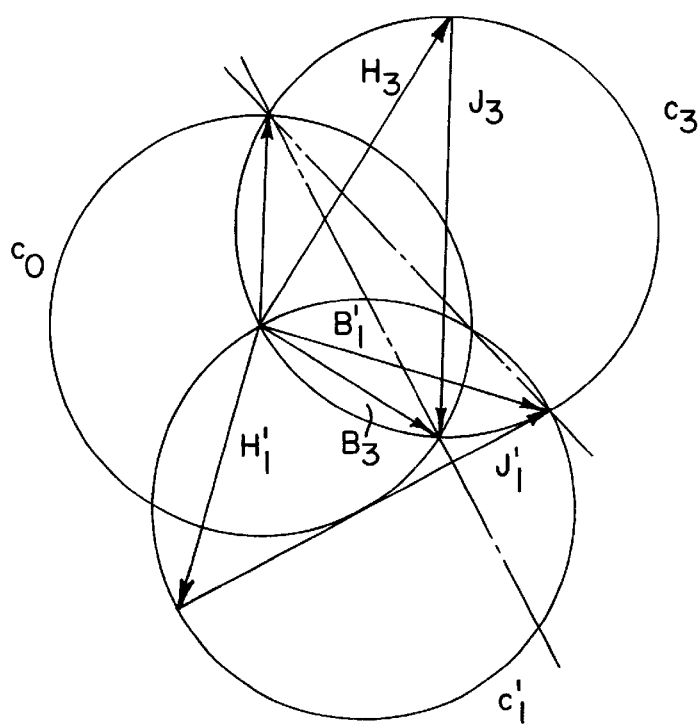
FIG. 10A illustrates a vector diagram for computation of the geometry of the yokeless magnet shown in FIG. 10.

FIG. 10 is another example of a yokeless construction but in this case with a hexagonal cavity 85 and, again, with the point F located at the corner $P_3$ of the cavity 85. The cross section of the yokeless magnet is shown with the heavy line 86 again indicating a high permeability ($\mu = \infty$) partial yoke. The arrows show the orientation of the remanences J in several components of the structure. In particular, the vector diagram of FIG. 10A provides the values of $J'_1$ and $J_3$ for the FIG. 10 geometry.

The yokeless magnets of FIGS. 9 and 10 make use of more magnetic material than the yoked magnet of FIG. 6, i.e., the yokeless magnet has a lower figure of merit. However, as will be understood from the referenced patents and publications, the two structures can be combined into a closed hybrid structure with a uniform field oriented perpendicular to a planar high permeability plate at the cavity base and with the hypothetical high permeability parallel membrane closing off the opposite side of the cavity in the direction of the field.

5. OPENING THE MAGNET

As previously explained, a basic concept of the invention is first to configure the magnetic structure as if a hypothetical high permeability membrane, parallel to the high permeability plate at the cavity base, closed off the opening and thus equipotential surfaces existed both at the high permeability plate and at the parallel membrane, and then to remove the hypothetical membrane. This results, we have found, in a magnetic structure with a top opening that will still generate a magnetic field of sufficient uniformity within the region of interest adjacent the high permeability plate to make possible MRI of a patient positioned on or adjacent the plate while allowing access to the patient. This will now be demonstrated.

Figure 11:
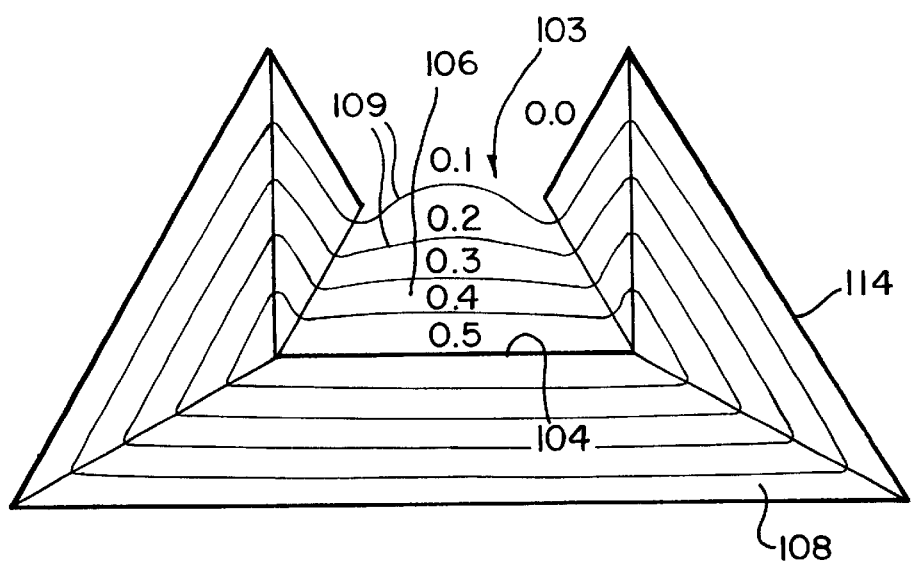
FIG. 11 illustrates the equipotential lines within the trapezoidal cavity of the open yoked magnet of FIG. 6.
Figure 11A:
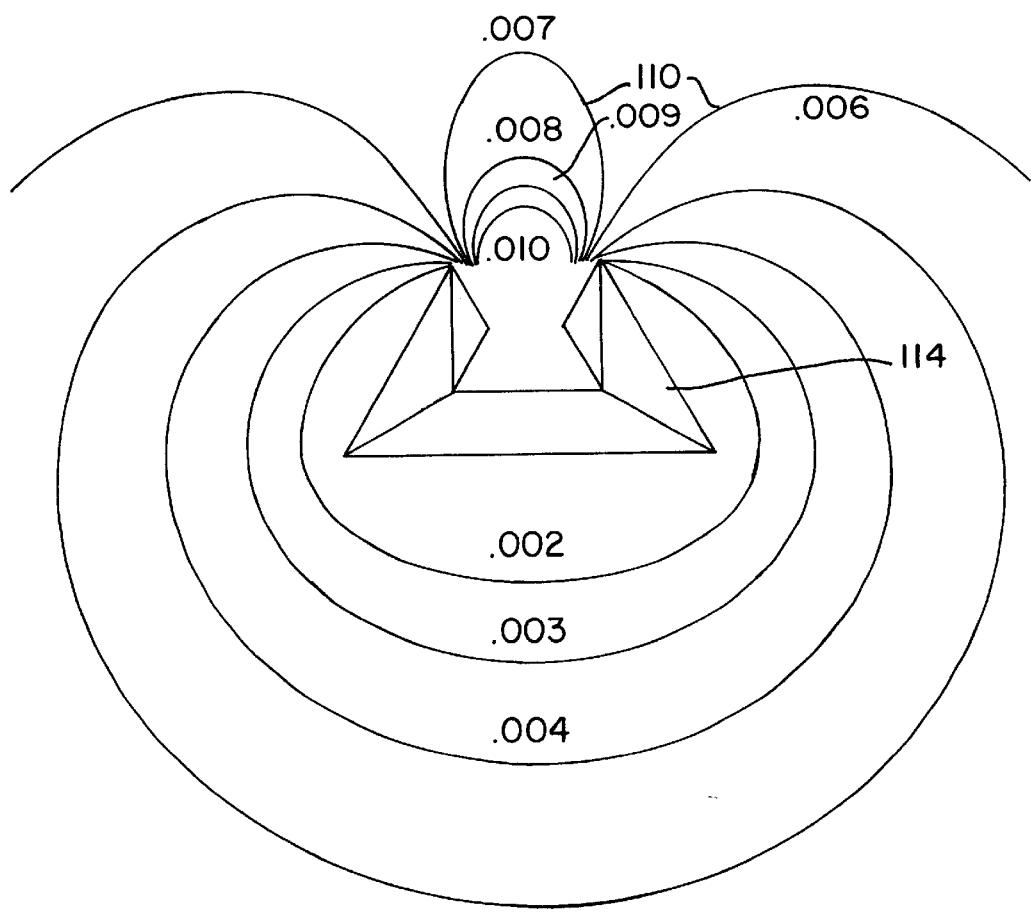
FIGS. 11A and 11B illustrate, respectively, the equipotential and equifield lines of the fringe field of the open yoked magnet of FIG. 6.
Figure 11B:
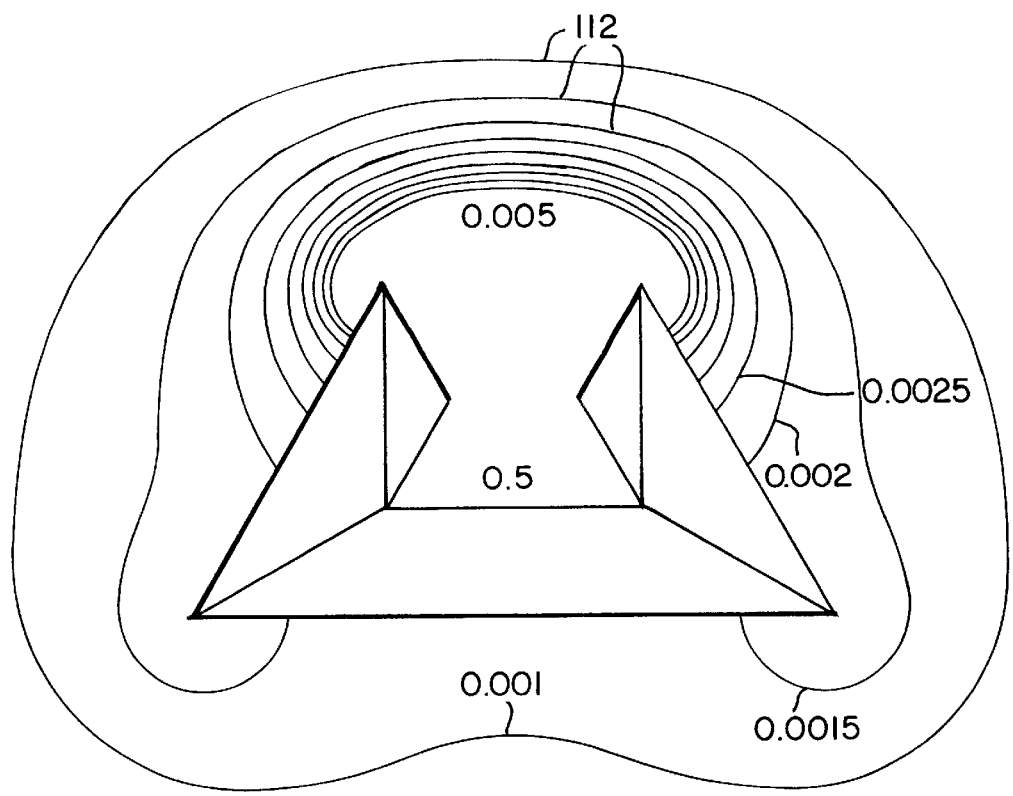

Assume now that the structures developed in the previous sections are opened by removing the ($P_3$,$P_4$) section of the $\mu = \infty$ yoke. For instance, consider the opening 103 of the trapezoidal cavity of the yoked magnet of FIG. 6 by removing the ($P_3$, $P_4$) section of the $\mu = \infty$ yoke. FIG. 11 shows the distortion of the field within the cavity with the $\mu = \infty$ plate 104 inserted at the interface between the cavity 106 and the main prism 108 of magnetic material. The equipotential lines are designated 109. The cross section of the open magnet of FIG. 11 corresponds to the cavity dimensions $$x_3 = \frac{x_1}{2}, \quad y_c = \frac{\sqrt{3}}{2} x_1 \tag{25}$$

and K=0.5. The opening of the cavity results in the generation of a field outside the magnet, as shown in FIG. 11A, with the plotting of the equipotential lines 110 of the fringe field of the magnet. The equifield lines 112 outside the magnet are plotted in FIG. 11B. The plotting of the equipotential lines 110 in FIG. 11A shows that the potential of the yoke 114 does not coincide with the asymptotic value $\Phi_\infty$ of the potential in the surrounding medium at an increasingly large distance from the magnet. The potential of the yoke 114 relative to the reference potential $\Phi_\infty$ coincides with the potential of the equipotential lines that become parallel to the x axis at $r \to \infty$. In the particular case of FIG. 11A the potential $\Phi_{yoke}$ of the yoke is $$\frac{\mu_0(\Phi_{yoke} - \Phi_\infty)}{y_0 J_0} \sim 6 \cdot 10^{-3}, \tag{26}$$

where $y_c J_0/\mu_0$ is the maximum value of the potential on the ($P_1$,$P_2$) interface, in the ideal case of a closed cavity.

Figure 11C:
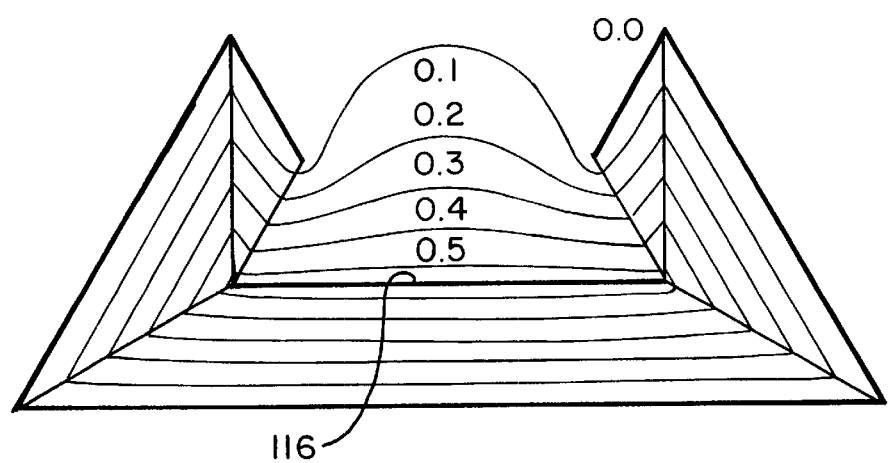
FIG. 11C illustrates the equipotential lines of the open yoked magnetic structure of FIG. 6 with an enlarged cavity.

The distortion of the field inside the cavity of the open magnet, and the fringe field depend upon the geometry of the trapezoidal cavity. For instance, FIG. 11C shows the effect of enlarging the x-dimensions of the open cavity to the new dimensions $$x_3 = \frac{2}{3}x_1, \quad y_0 = \frac{\sqrt{3}}{4}x_1, \tag{27}$$

for the same value K=0.5, with the pole piece 116 present.

Figure 12:
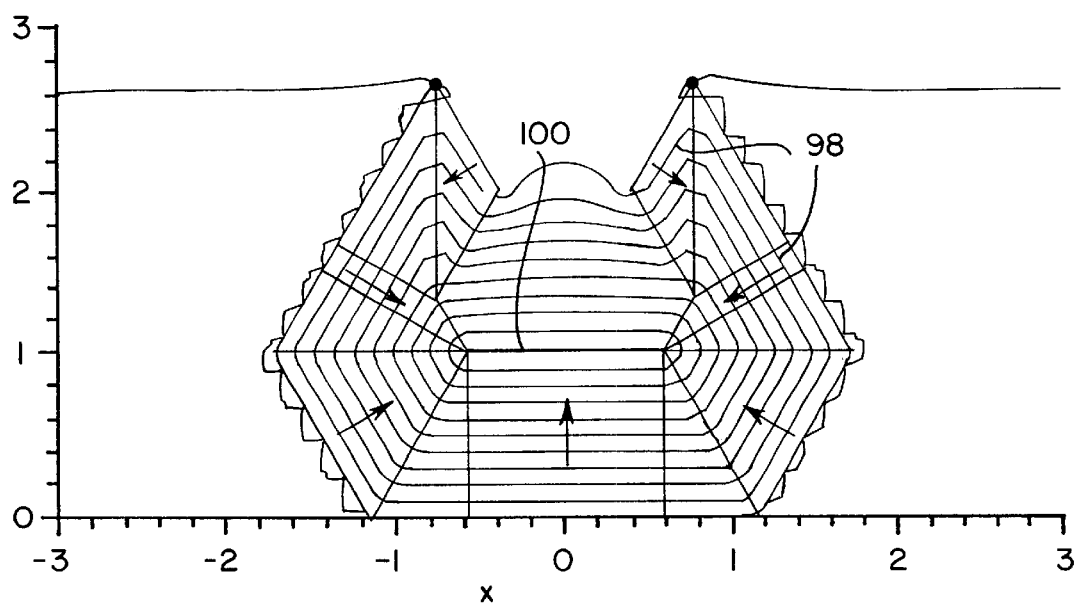
FIG. 12 illustrates the field distortion resulting when a yoked magnetic structure like that of FIG. 4 is opened at the top to provide access to the cavity.
Figure 12A:
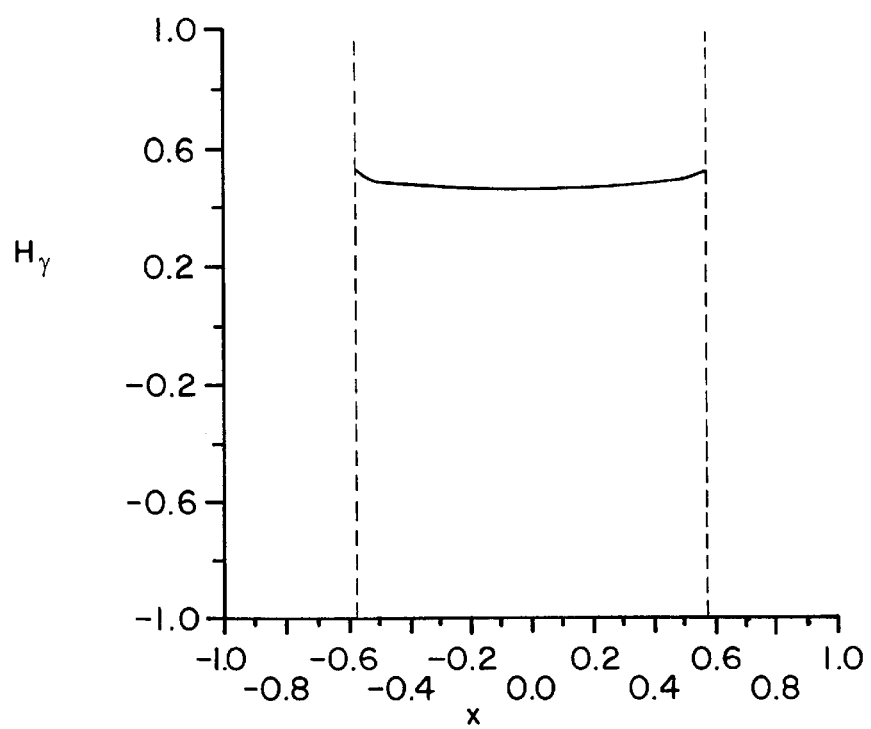
FIGS. 12A and 12B are graphs illustrating the field distribution on the x and y axes, respectively, of the cavity of the open yoked magnet of FIG. 12.
Figure 12B:
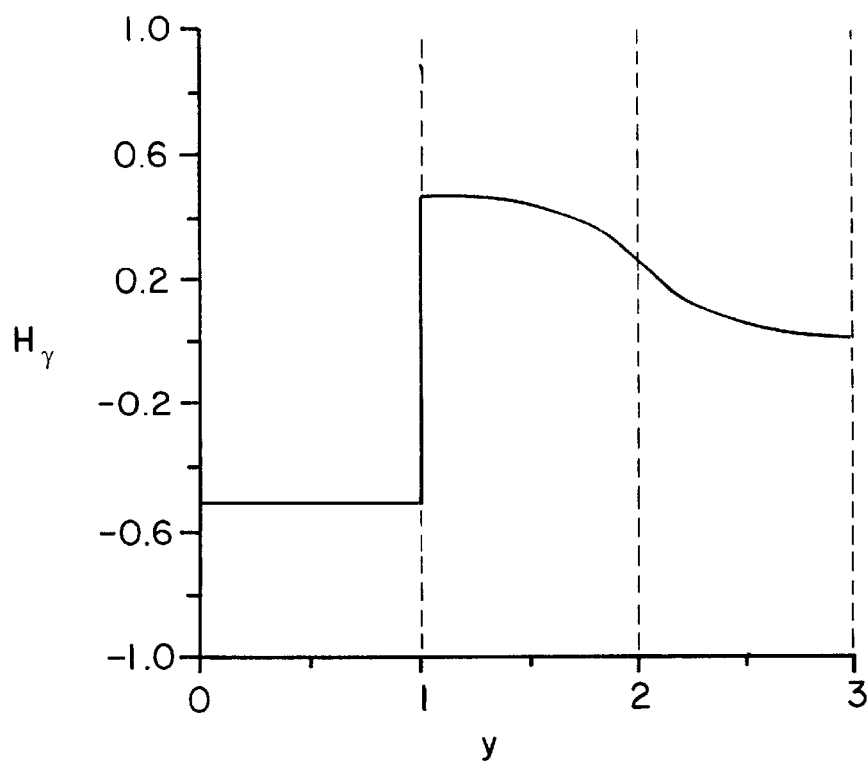
Figure 12C:
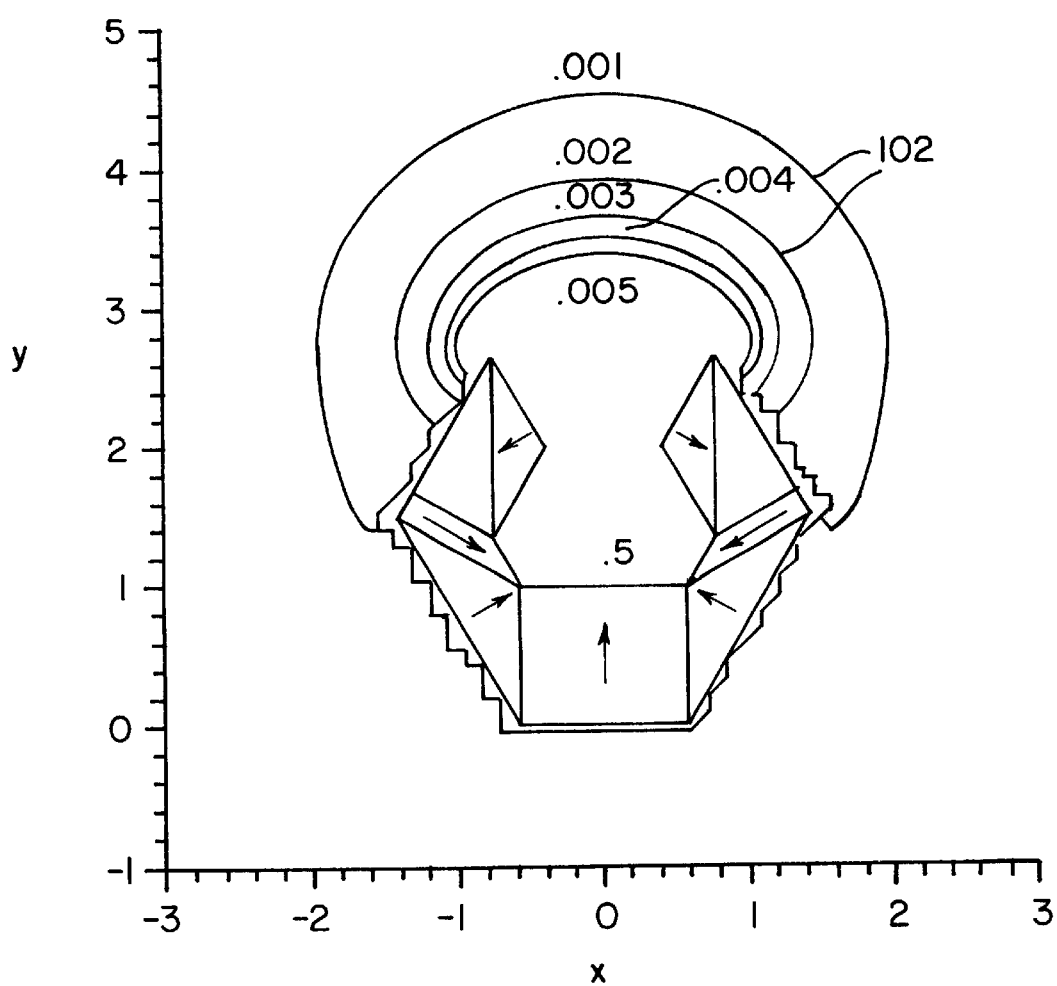
FIG. 12C illustrates the fringe field of the open yoked magnet of FIG. 12.

FIG. 12 shows how the opening of the cavity of the yoked FIG. 4 embodiment having a hexagonal cavity distorts the field inside the cavity and generates a fringe field in the surrounding medium. For instance, FIG. 12 shows the equipotential lines 98 inside the magnetic structure with the assumption that side ($P_1$, $P_2$) is transformed by means of an ideal $\mu=\infty$ plate 100. The distribution of the intensity H on the axes x, y is shown in FIGS. 12A and 12B, respectively. The equifield lines 102 of the fringe field are plotted in FIG. 12C which clearly shows how rapidly the fringe field decreases with the distance from the magnet. Note the field intensity of 0.5 $J_0$ at the cavity bottom which falls to 0.005 $J_0$ a short distance above the open top.

Figure 13A:
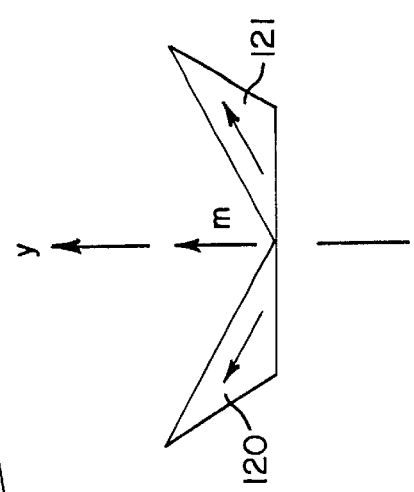
FIG. 13A illustrates an equivalent magnetic structure to that of the opened yokeless magnetic structure of FIG. 7.
Figure 13:
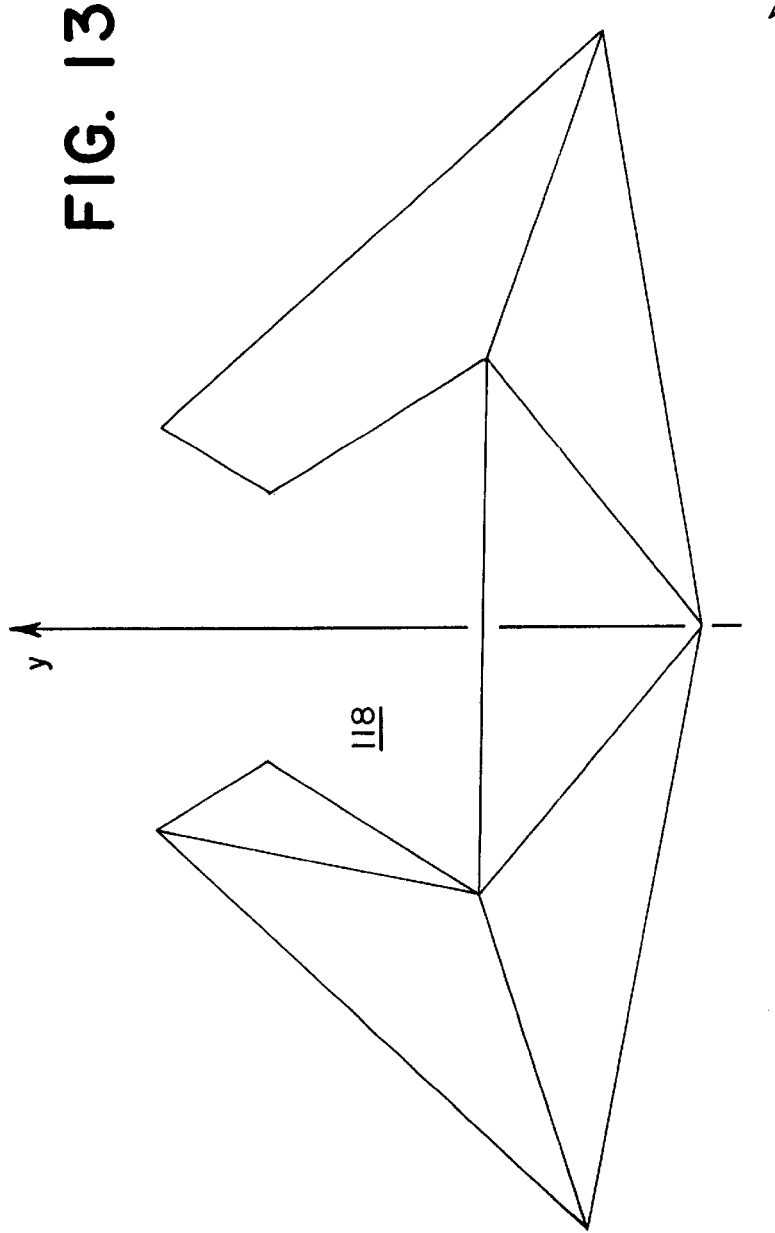
FIG. 13 illustrates opening of the yokeless magnetic structure of FIG. 7B.
Figure 13B:
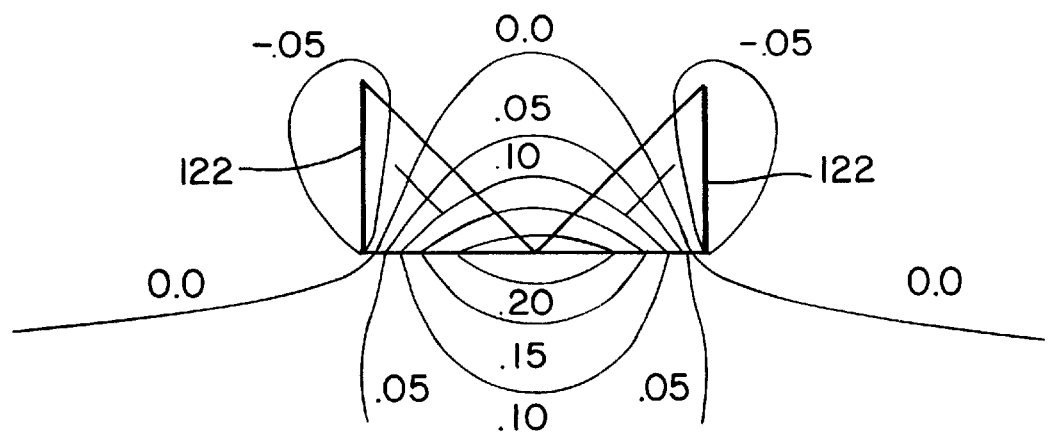
FIG. 13B illustrates the equipotential lines of the open yokeless magnetic structure of FIG. 7.
Figure 13C:
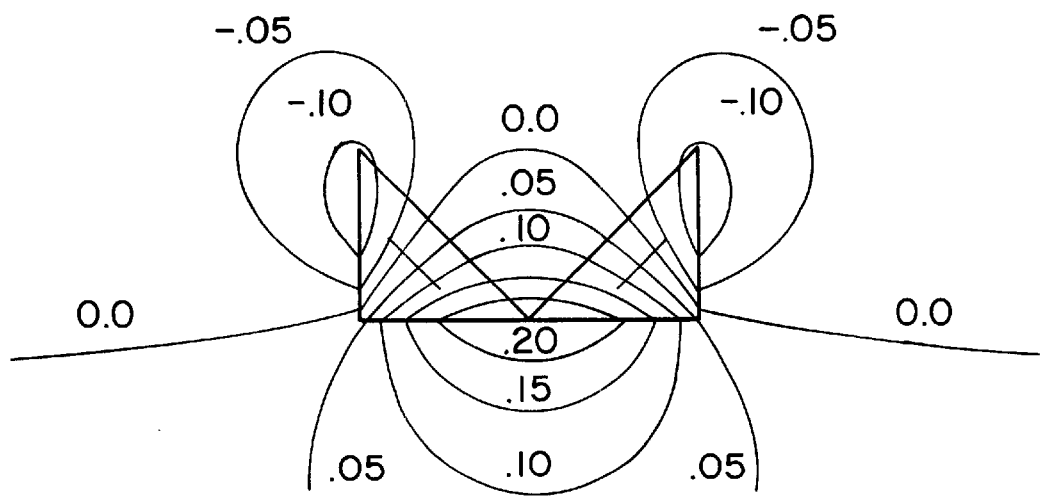
FIG. 13C illustrates the equipotential lines of the open yokeless magnetic structure of FIG. 7 with the partial yoke omitted.

FIG. 13 shows the opening of the cavity 118 of the yokeless magnet of FIG. 7B. Without strapping, the effect of the opening is a field distortion equal to the field generated by the two triangles 120 (F, $P_3$, $Q_3$) and 121 ($P_4$, F, $Q_4$) shown in FIG. 13A. At large distances the field generated by the triangles of magnetic material of FIG. 13A is the field of a dipole oriented along the axis y as shown in FIG. 13A. FIG. 13C shows the equipotential lines of the field generated by the structure of FIG. 13B in the absence of the two ferromagnetic strips 122 attached to the sides ($P_3$, $Q_3$) and ($Q_4$, $P_4$). The comparison of FIGS. 13B and 13C illustrates the beneficial effect of the partial yoke 122 in reducing the fringe field.

Figure 14:
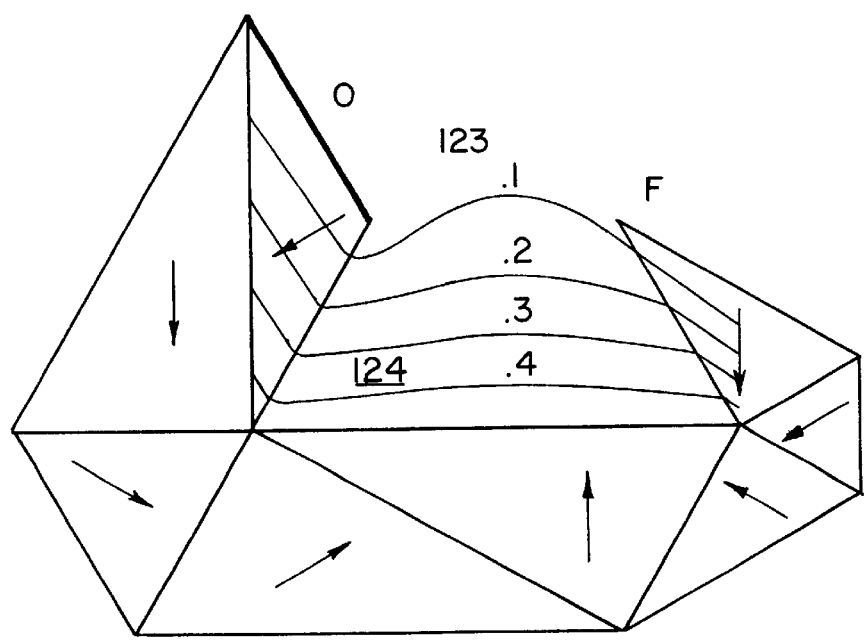
FIG. 14 illustrates the equipotential lines within the trapezoidal cavity of an open yokeless magnet in accordance with the invention similar to that of FIG. 9.

The opening of the yokeless structure of FIG. 9 is shown in FIG. 14, with the field configuration 123 inside the cavity 124.

Figure 15:
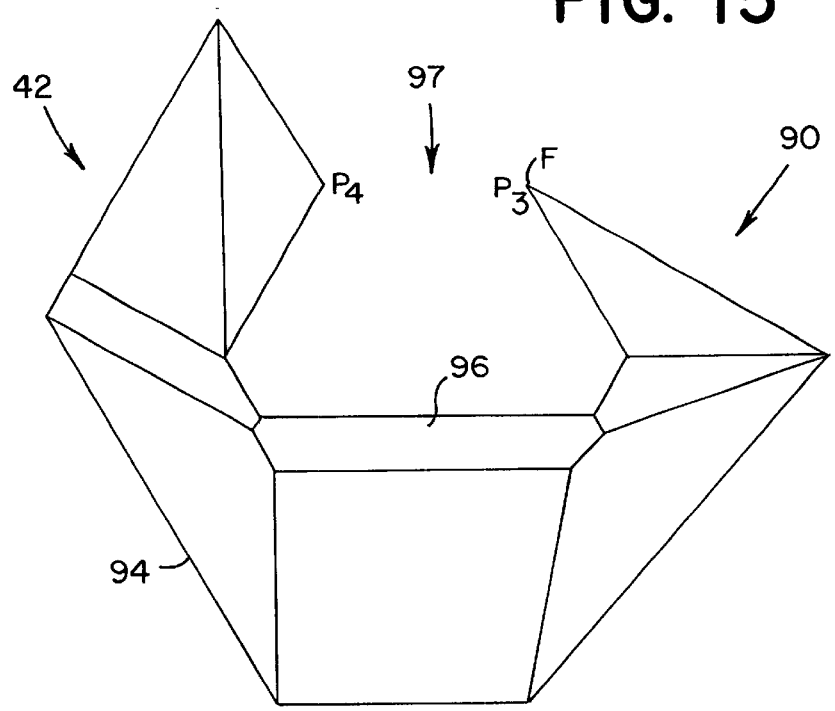
FIG. 15 illustrates one form of geometry of a hybrid L-shaped magnet for K=0.5 in accordance with the invention.

As previously indicated, the two structures, yoked and yokeless, can be combined into a hybrid structure in the way shown in FIG. 15, with the right half 90 being yokeless and the left half 92 yoked, the yoke being designated 94 and the pole piece 96. The resulting hybrid magnet, which has been opened 97 at the top, is more efficient than either the yoked or yokeless structure, with a figure of merit of $$M \approx 0.11 \tag{23}$$

and a weight per unit length in the z direction of $$W \approx 4.25 \; T/m. \tag{24}$$

The schematic of FIG. 15 provides the conceptual design for the development of an L-shaped magnet for interventional applications.

Figure 15A:
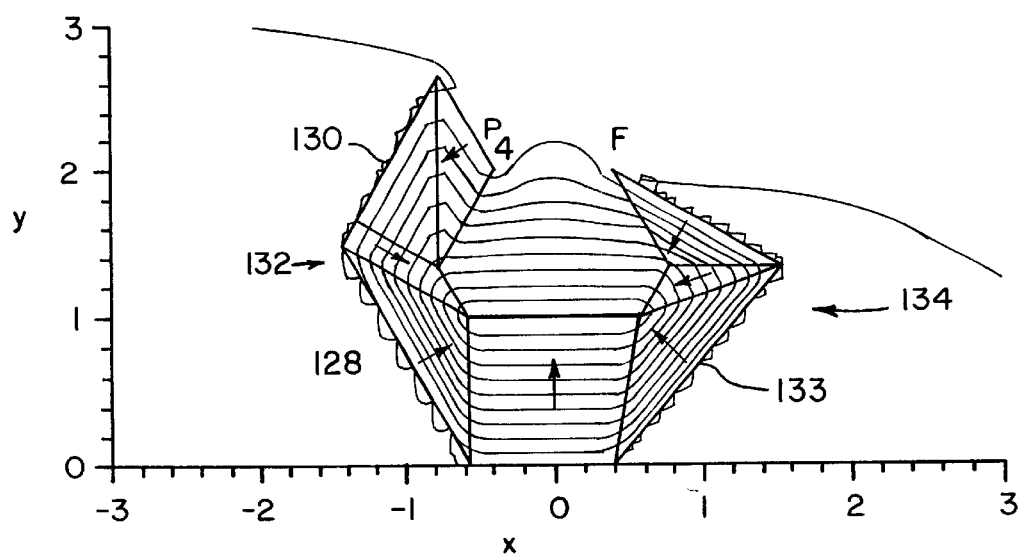
FIG. 15A illustrates the equipotential lines resulting from the opening of the hybrid magnet of FIG. 15.
Figure 15B:
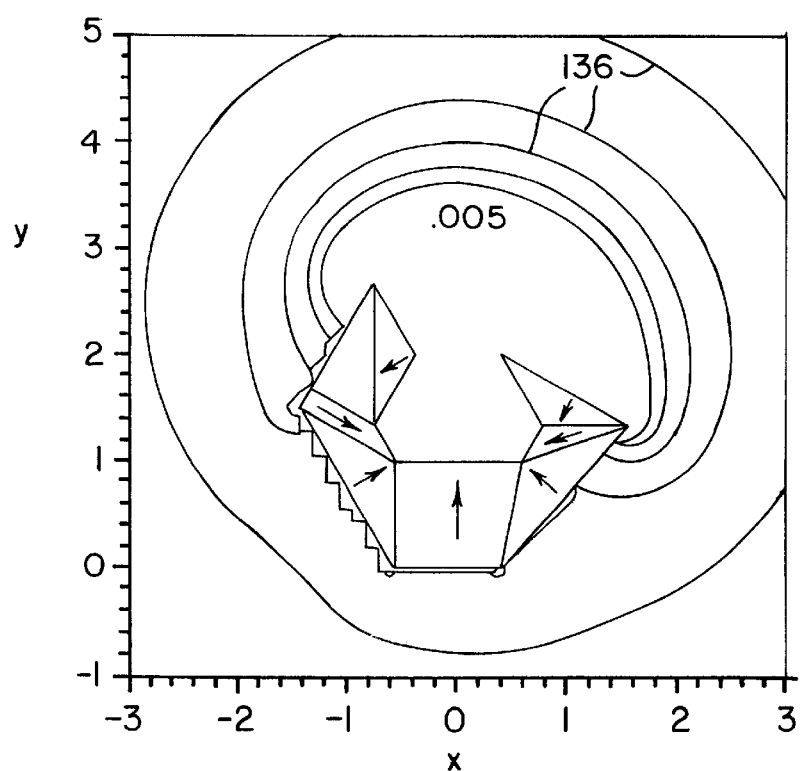
FIG. 15B illustrates the fringe field due to the opening of the hybrid magnet of FIG. 15.
Figure 15C:
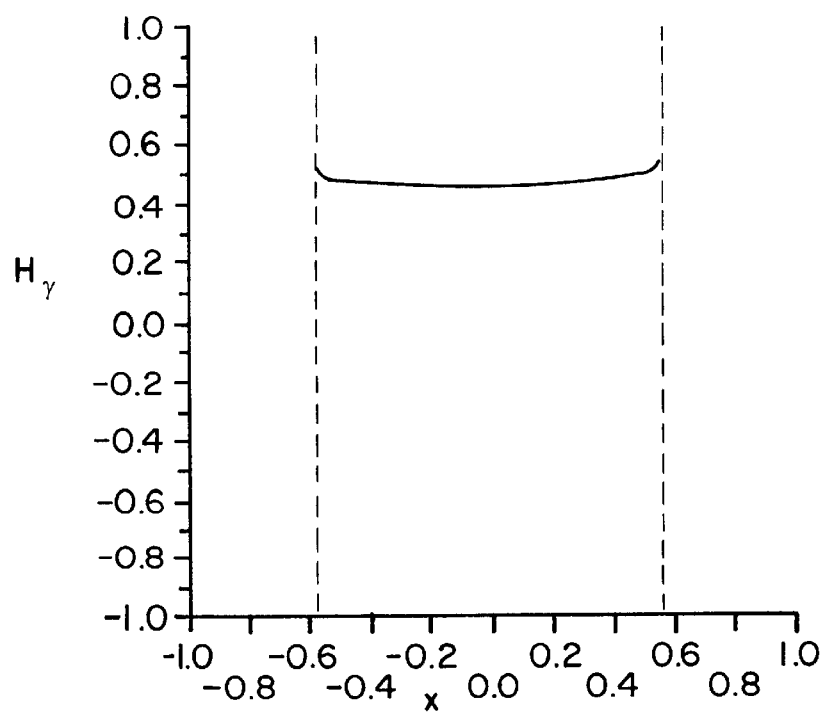
FIGS. 15C and 15D are graphs illustrating the field distribution on the x and y axes, respectively, of the cavity of the open hybrid magnet of FIG. 15.
Figure 15D:
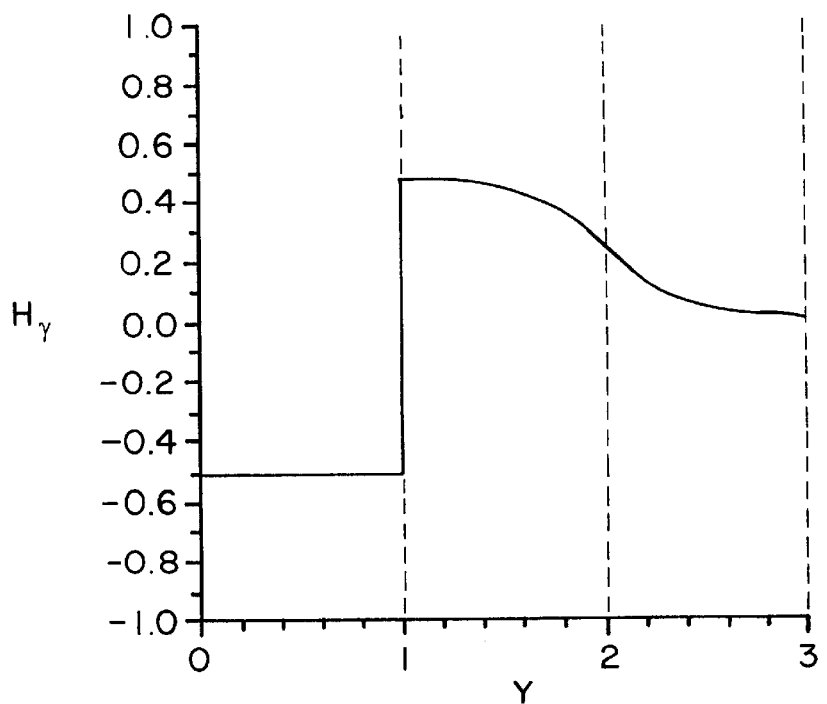
Figure 15E:
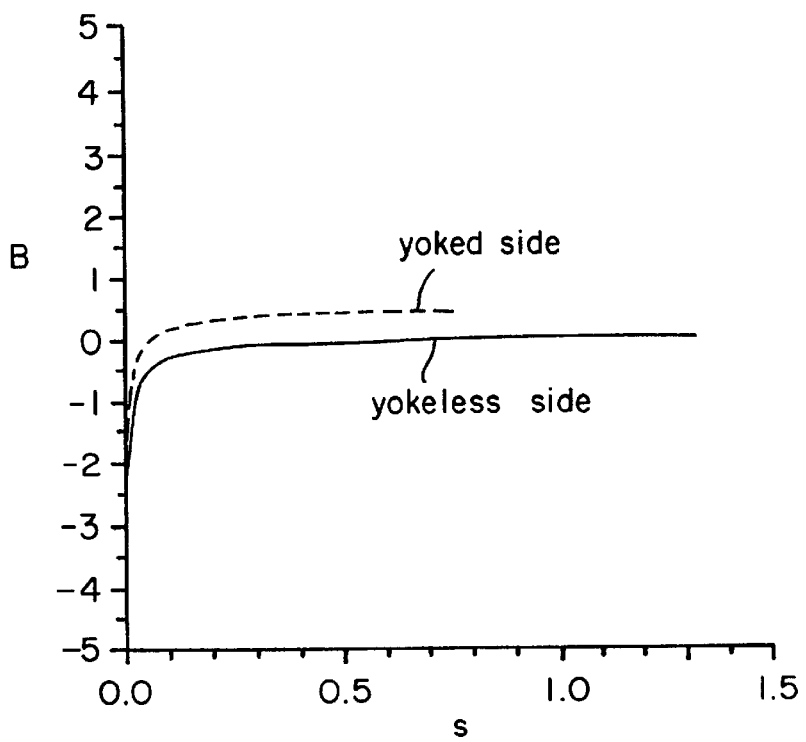
FIGS. 15E and 15F illustrate the flux entering the yoke for the open hybrid magnet of FIG. 15.
Figure 15F:
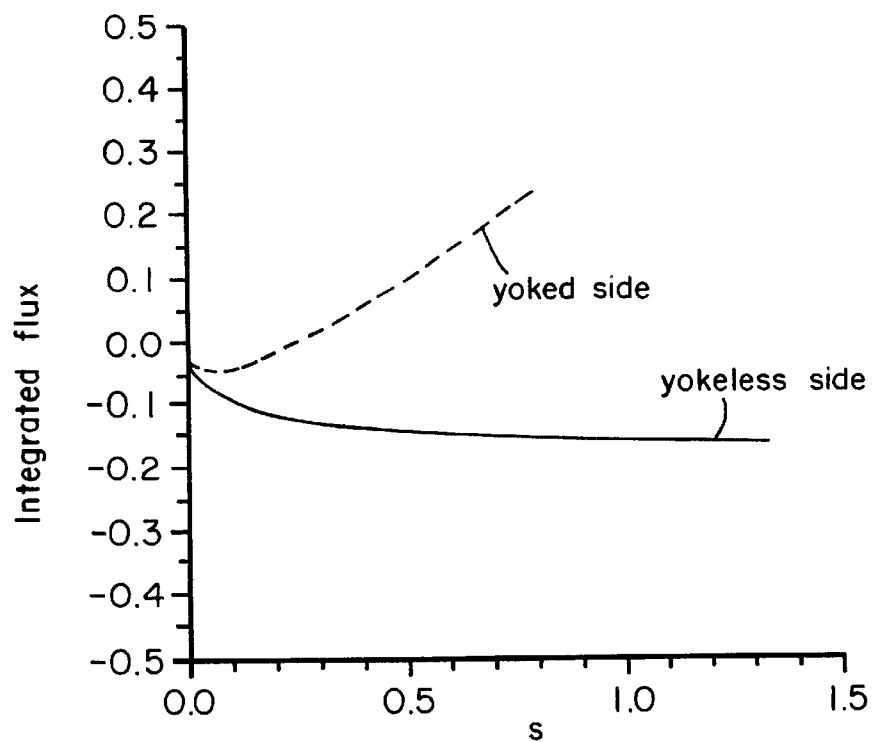

FIG. 15A shows the field distortion caused by the opening of the hybrid structure of FIG. 15 with the assumption of zero thickness of the pole piece 128 and a $\mu=\infty$ layer lining of the entire external surface of the magnetic structure. That lining 130 on the left side 132 acts as a yoke, and 133 on the right side 134 acts as a strap. The equifield lines 136 of the fringe field are shown in FIG. 15B and the field intensity is plotted versus axes x, y in FIGS. 15C and 15D, respectively. The effectiveness of the yoked side (on the left) of the structure of FIG. 15 is shown in FIG. 15E where the magnetic induction entering the external surface is plotted versus the distance from points $P_4$ and F. Due to the opening, B has a singularity at both points $P_4$ and F (FIG. 15). On the yoked side 92, 132, B converges rapidly to the ideal value B=$J_3$/2 and on the yokeless side 90, 134, B converges to zero. The integrated flux of B on both sides is shown in FIG. 15F. Note, again, how rapidly in the FIG. 15B embodiment the field intensity at the cavity bottom falls a short distance above the open top.

FIGS. 11–15 show that the field adjacent the pole piece in the open cavity, within the region of interest, is reasonably uniform, and, importantly, that the fringe field leaking into the surrounding medium is extremely low. However, further improvement is possible as described in the following sections.

6. DISTORTION COMPENSATION

A partial correction of the field distortion caused by the removal of the ($P_3$, $P_4$) section of the cavity can be achieved by modifying either the geometry of the pole piece or the structure of the magnetic material. The detailed analysis of the solution of the distortion compensation, including magnetization tolerances in an actual three dimensional magnet, will be evident from the referenced patents and publications cited above. The principle of the technique described in this application takes advantage of the $\mu=\infty$ plate inserted at the interface ($P_1$, $P_2$) between cavity and main body of the magnetic material. The partial correction is achieved by adding a compensating magnetic structure on the surface of that $\mu=\infty$ plate, in a way similar to the development of filter structures introduced in the past as described in detail in the referenced papers, patents, and applications.

Figure 16:
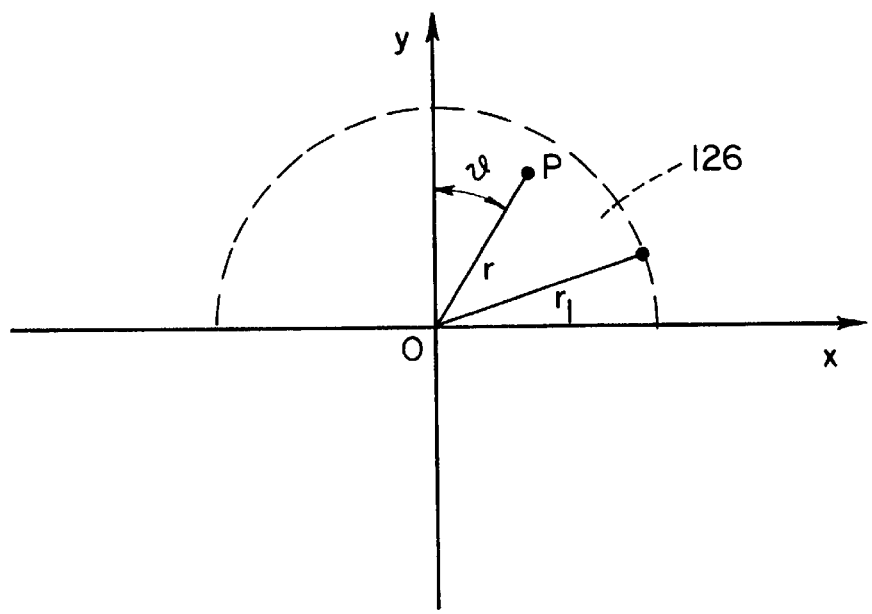
FIGS. 16, 17, and 17A are views illustrating how compensation for magnet tolerances can be achieved.

As shown in FIG. 16, a basis for computation of one form of compensation structure comprises a cylindrical frame of reference r, $\theta$, $\xi$, selected such that the axis $\xi$ coincides with the center line of the $\mu=\infty$ plate and the plane $\theta=0$ is perpendicular to the plate. Assume, for example, that the region of interest is 126 contained between the high permeability plate and a cylindrical surface r=$r_1$. The magnetostatic potential generated by the two dimensional open structure within the cylinder of radius $r_1$ can be expanded in the series $$\Phi(r, \theta) = \Phi_0 + \sum_{n=0}^{\infty} a_n \left(\frac{r}{r_1}\right)^{2n+1} \cos(2n+1)\theta, \tag{28}$$

where $\Phi_0$ is the potential of the plate and the coefficients $a_n$ are the amplitudes of the harmonics generated by the opening of the magnet. At the surface of the $\mu=\infty$ plate, the intensity of the magnetic field reduces to the component $H_y$, and, because of symmetry, the odd-order derivatives of $H_y$ with respect to r satisfy the condition $$\left(\frac{\partial^{2n+1} H_y}{\partial x^{2n+1}}\right)_{x=0} = 0 \quad (n = 1, 2, 3, \ldots), \tag{29}$$

and the even order derivatives satisfy the equation $$\left(\frac{\partial^{2n} H_y}{\partial x^{2n}}\right)_{x=0} + (-1)^{n+1}\left(\frac{\partial^{2n} H_y}{\partial y^{2n}}\right)_{x=0} = 0. \tag{30}$$

The coefficients $\alpha_n$ of expansion (28) are related to the derivatives of $H_y$ by the equation $$\left(\frac{\partial^{2n} H_y}{\partial r^{2n}}\right)_{\substack{r=0 \\ \theta=0}} = \frac{(2n)!}{r_1^{2n+1}} a_n. \tag{31}$$

The correction of the field distortion is achieved by eliminating a number of harmonics up to the point where the desired field uniformity is reached within the cylinder of radius $r_1$. The amplitude of the harmonics decreases rapidly with n and, as a consequence the correction involves only the lowest order n harmonics. The elimination of the harmonics is accomplished by modulating the potential $\Phi_0$ of the plate outside the region of width $2r_1$, with a modulation $\Phi'$ that satisfies the symmetry condition $$\Phi'(x)=\Phi'(-x) \tag{32}$$

In principle the modulation $\Phi'$ is generated by a distribution of dipoles on the $\mu=\infty$ plate, of dipole moment p(x) per unit surface $$p(x)=\mu_0 \Phi'(x)n, \tag{33}$$

where n is a unit vector oriented perpendicular to the surface of the plate. Assume that the dipole moment distribution is confined to the regions $r_1<r<r_2$, where $r_2$ is sufficiently small compared to the dimension of the $\mu=\infty$ plate. The potential generated by the dipole distribution within the cylinder of radius $r_1$ is $$\Phi_i(r,\theta) = \sum_{n=0}^{\infty} c_{in}\left(\frac{r}{r_1}\right)^{2n+1} \cos(2n+1)\theta, \tag{34}$$

where the coefficients of the harmonics are $$c_{in} = \frac{(-1)^n r_1^{2n+1}}{\pi \mu_0} \int_{r_1}^{r_2} \frac{p(r)}{r^{2(n+1)}} dr \tag{35}$$

and the distortion of the field caused by the magnet opening is corrected if the magnitude of the dipole moment distribution p(r) satisfies the system of integral equations $$\frac{(-1)^n}{\pi\mu_0} \int_{r_1}^{r_2} \frac{p(r)}{r^{2(n+1)}} dr = -\frac{a_n}{r_1^{2n+1}} = -\frac{1}{(2n)!}\left(\frac{\partial^{2n} H_y}{\partial r^{2n}}\right)_{\substack{r=0 \\ \theta=0}} \tag{36}$$

$(n = 0, 1, 2, \ldots)$

The n=0 equation corresponds to a uniform or average value of the field generated by the dipole distribution within the cylinder of radius $r_1$. Consequently the elimination of the n=0 harmonic may be excluded from the design of the filter structure and the dipole distribution is limited to the compensation of the n>0 harmonics, where the desired degree of field uniformity is achieved by a finite number $n=1,2,\ldots,n_0$ of Eq. (36). On the other hand, in addition to the requirement of eliminating the $n_0$ harmonics, the dipole distribution should not generate additional unwanted har monics $n>n_0$. As a consequence, for $n>n_0$, p(r) should satisfy the condition $$\int_{r_1}^{r_2} \frac{p(r)}{r^{2(n+1)}} dr = 0 \qquad (n > n_0) \tag{37}$$

To satisfy Eqs. (37), p(r) must oscillate between positive and negative values in the interval $r_2-r_1$.

Figure 17:
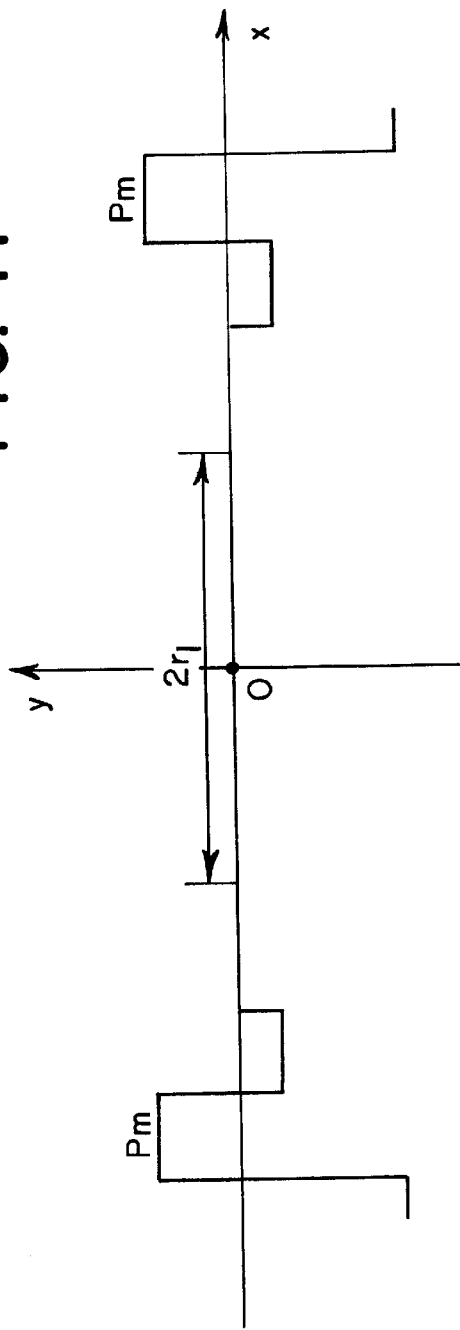

A unique solution of Eqs. (36), (37) requires the introduction of additional constraints in the distribution of p(r). Assume, for instance, that the interval $r_2-r_1$ is divided in a number $n_t$ of strips equal to the total number of Eqs. (36, 37) and assume that p(r) has a constant value of $p_m$ in each strip, as shown in the schematic of FIG. 17. Furthermore assume that the value of $p_m$ in the m-th strip contributes equally to the $n_t$ harmonic independent of the position of the strip. Thus the width $r_{m2}-r_{m1}$ of th m-th strip is assumed to be $$r_{m1}^{1-2n_t} - r_{m2}^{1-2n_t} = \frac{1}{n_t}\left[r_1^{1-2n_t} - r_2^{1-n_t}\right], \tag{38}$$

and the system of integral equations (36), (37) reduces to a system of $n_t$ linear equations in the $n_t$ variables $p_m$.

Figure 17A:
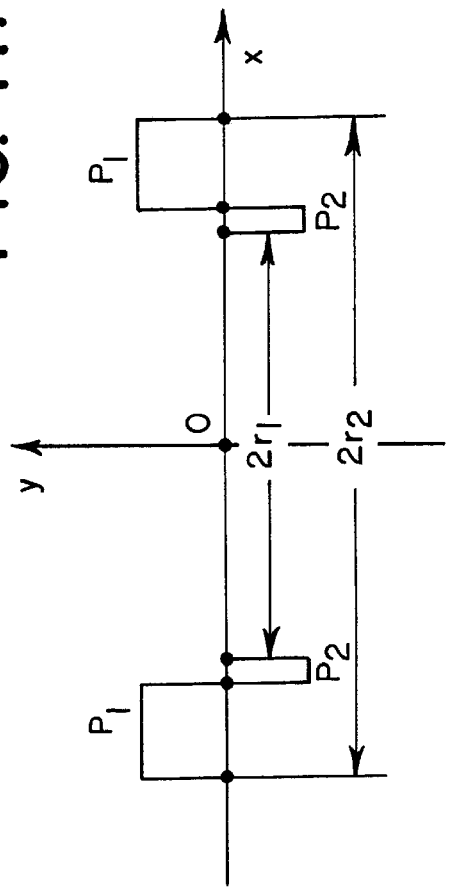

A simple example is a structure designed to eliminate only the second derivative of $H_y$ without introducing an additional fourth order derivative. The structure reduces to a division of the interval of $r_2-r_1$ in two strips as indicated in the schematic of FIG. 17A. Assume the values $r_2$, $r_1$ $$r_1=1.4, \; r_2=2.0, \tag{39}$$

normalized to an arbitrary height $y_c$ of the cavity. By virtue of Eq.(38) for $n_t=2$, the interface between the two strips is located at $$r_{1,2} \approx 1.56. \tag{40}$$

By definition the dipole moment densities of the two strips are $$p_1 = -p_2 \tag{41}$$

and the value of $p_1$ in the outermost strip is given by the equation $$\left[-\int_{r_1}^{r_{1,2}} \frac{dr}{r^4} + \int_{r_{1,2}}^{r_2} \frac{dr}{r^4}\right] p_1 = \frac{2}{3}\mu_0 r_1^3 c_{i1}, \tag{42}$$

i.e., $$p_1 \approx 2.5 \; 10^2 \; \alpha_1. \tag{43}$$

If the condition of absence of the fourth derivative is removed, the second derivative of $H_y$ can be eliminated by a single strip of width $r_2-r_{1,2}$ with a uniform distribution of dipole moment p $$p \approx 68 \; \alpha_1. \tag{44}$$

Other compensation schemes will be evident to the person skilled in this art by following the principles and examples given above and stated in the referenced papers and patents.

7. MODIFICATIONS OF THE MAGNETIC STRUCTURE

The actual geometry of the L magnet embodiment will be derived from the basic structures introduced in the previous sections, with modifications dictated by practical considerations and the constraints of a surgical application, which are applicable not only to the L magnet but also to the yoked and yokeless variants.

Figure 18:
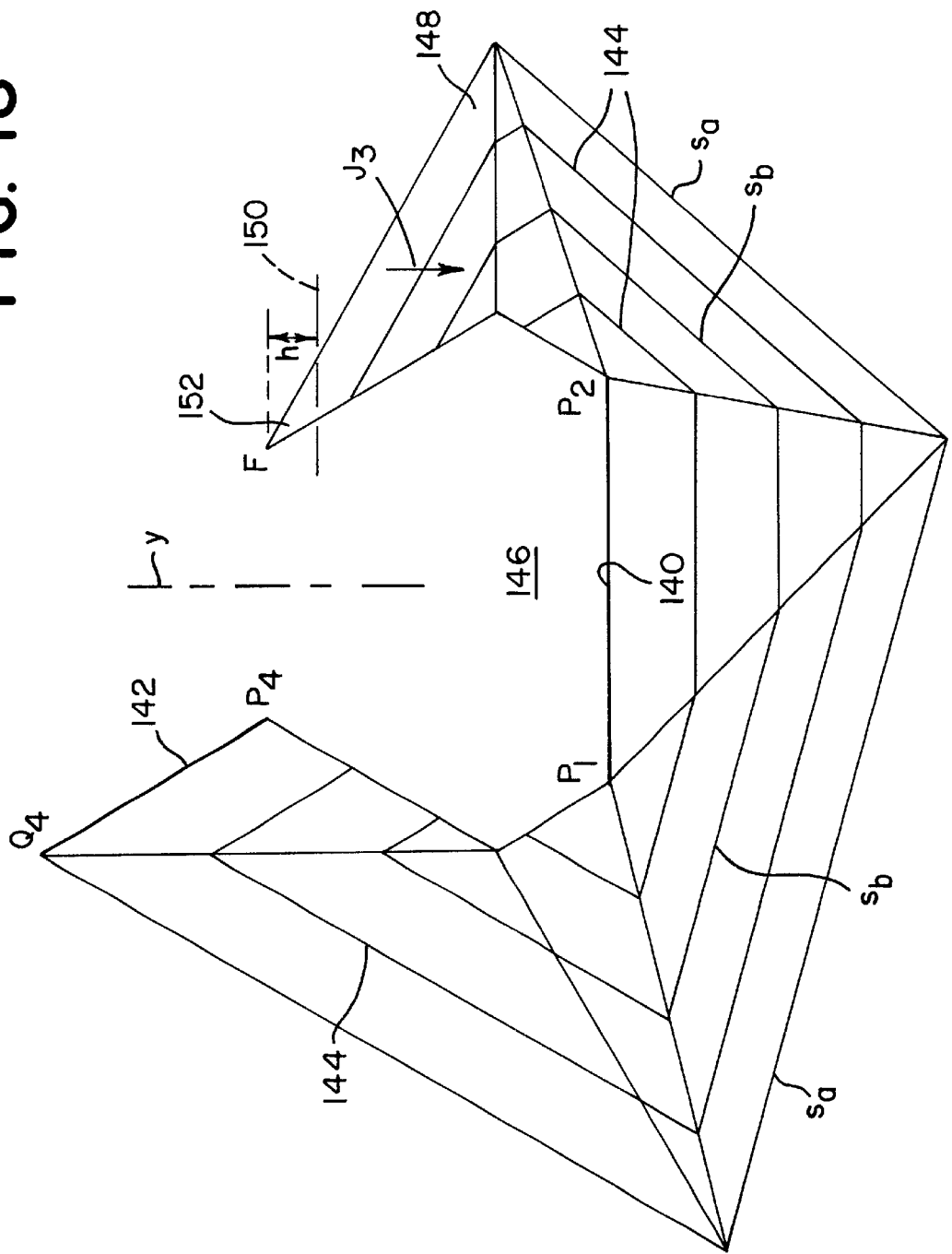
FIG. 18 illustrates one way of strapping the open yokeless structure of FIG. 9 in accordance with the invention.

The first modification is intended to minimize the effect of the magnetization tolerances that translate in a statistical distribution of a nonuniform field with a spatial wavelength of the order of the size of the blocks of magnetic materials used in the assembly of the magnet components. The bulk of the effect of the statistical distribution of J is compensated by the presence of the ferromagnetic pole piece 140, at the base of the cavity 146, that acts as a filter of the high frequency end of the spatial spectrum of J, in the yokeless structure of FIG. 18. The compensation is further improved by inserting high magnetic permeability straps in the magnetic structure as previously described. As one example, FIG. 18 shows the insertion of two straps in the yokeless structure of FIG. 18. One strap $s_a$ is located on the ideal $\Phi=0$ external surface of the magnet and a second strap $s_b$ is located on the $\Phi=\Phi_0/2$ equipotential surface inside the magnetic structure. The external strap is somewhat equivalent to the yoke of a magnet, except, as explained above, the basic difference between the yoke and the external strap is that the strap function is limited to closing the flux of the statistical fluctuation of the magnetic induction, while the yoke is designed to close the entire flux generated by the magnet. The heavy lines in FIG. 18 schematically represent the pole piece 140 ($P_1, P_2$) and the partial yoke 142 ($P_4, Q_4$) of the yokeless magnet. Also shown in FIG. 18 are the equipotential lines 144 of the ideal closed structure. From the practical magnet fabrication standpoint, the insertion of the internal strap $s_b$, makes it possible to divide the large components of the magnetic structure in smaller and more manageable components with a beneficial effect on the assembly of the magnet.

Figure 18A:
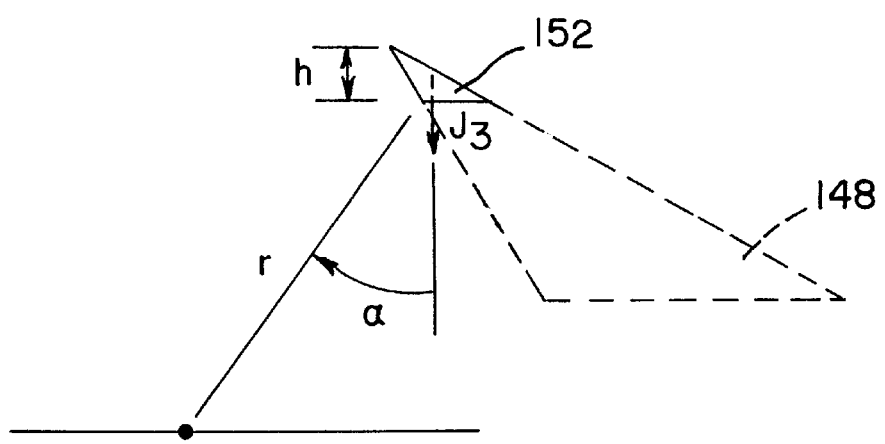
FIGS. 18A and 18B illustrate modifications of one of the components of the yokeless structure of FIG. 18.
Figure 18B:
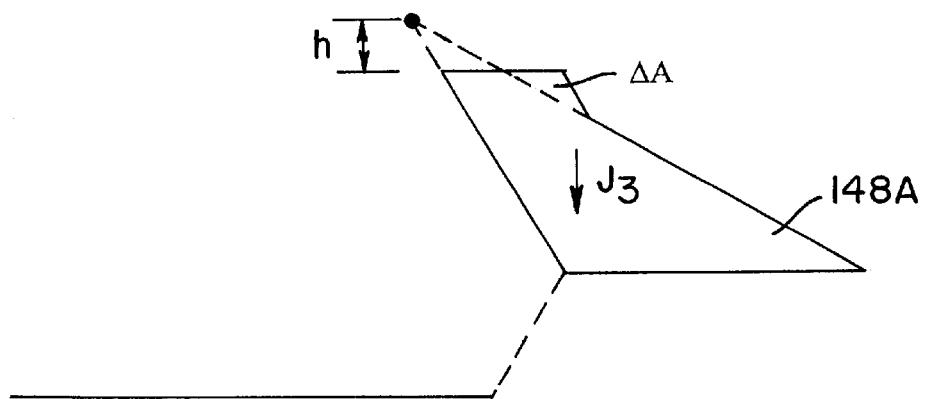

A second, important modification of the magnet structure is an improved access to the region of interest 146, which is located adjacent the pole piece 140, by reducing the height of the triangular component 148 of remanence $J_3$. As indicated in FIG. 18, the remanence $J_3$ is parallel to the axis y and the height of the triangle is reduced by a cut 150 perpendicular to $J_3$. If h is the distance of the cut from point F, the area $\Delta A$ 152 of magnetic material removed by the cut is $$\frac{\Delta A}{A} = \frac{4h^2}{3x_3^2} \tag{45}$$

and the effect on the field intensity at a point of the pole piece 140 is the intensity H of a dipole oriented along the axis y and dipole moment $$m = -J_3 \Delta A \tag{46}$$

and the magnitude of H is of the order $$\frac{\mu_0 |H|}{J_0} \approx \frac{\Delta A}{\pi r^2} \cos 2\alpha = \frac{1}{\pi\sqrt{3}} \left(\frac{h}{r}\right)^2 \cos 2\alpha \tag{47}$$

where r, $\alpha$ are the radial and angular coordinates of a point of the pole piece, relative to $\Delta A$, as indicated in FIG. 18A. Thus the effect of area $\Delta A$ of remanence $J_3$ changes sign at a point of the pole piece where $\alpha=\pi/4$. As long as h is sufficiently small compared to $x_3$ (see FIG. 3), a partial compensation of the removal of area $\Delta A$ 152 is achieved by modifying 148A the triangular component of remanence $J_3$ in the way shown in FIG. 18B, where, in principle, the triangle $\Delta A$ is moved below the horizontal plane whose distance from F is equal to h. The actual compensation of the geometry of the modified geometry of the component of remanence $J_3$ is readily accomplished as part of the overall design of a filter structure to compensate for field distortions, as described in the referenced papers and patents.

Following the design approach defined herein, an actual magnet can be developed as a section of length $2z_0$ of the two dimensional structures defined in Section 5. If $2z_0$ is large compared to the dimensions of the magnet cross section, the effect of the finite length on the field close to the center of the pole piece reduces to a small perturbation of the solution derived in the two dimensional structures, and the same filter structure of strips developed in Section 6 can be used to compensate for the additional distortion caused by the finite length. If, on the other hand, length and transversal dimensions are all of the same order, the filter design becomes a true three-dimensional problem, where the cylindrical surface of radius $r_1$ introduced in Section 6 is replaced by a spherical surface whose center may coincide with the center of the pole pieces. The same logic of the two dimensional filter structure applies to a three dimensional filter designed to cancel the spherical harmonics of the field distortion within the sphere. The detailed design and analysis of filter structures of three dimensional magnets are not necessary to an understanding of the present invention and involve an extension of the principles outlined above.

Figure 19:
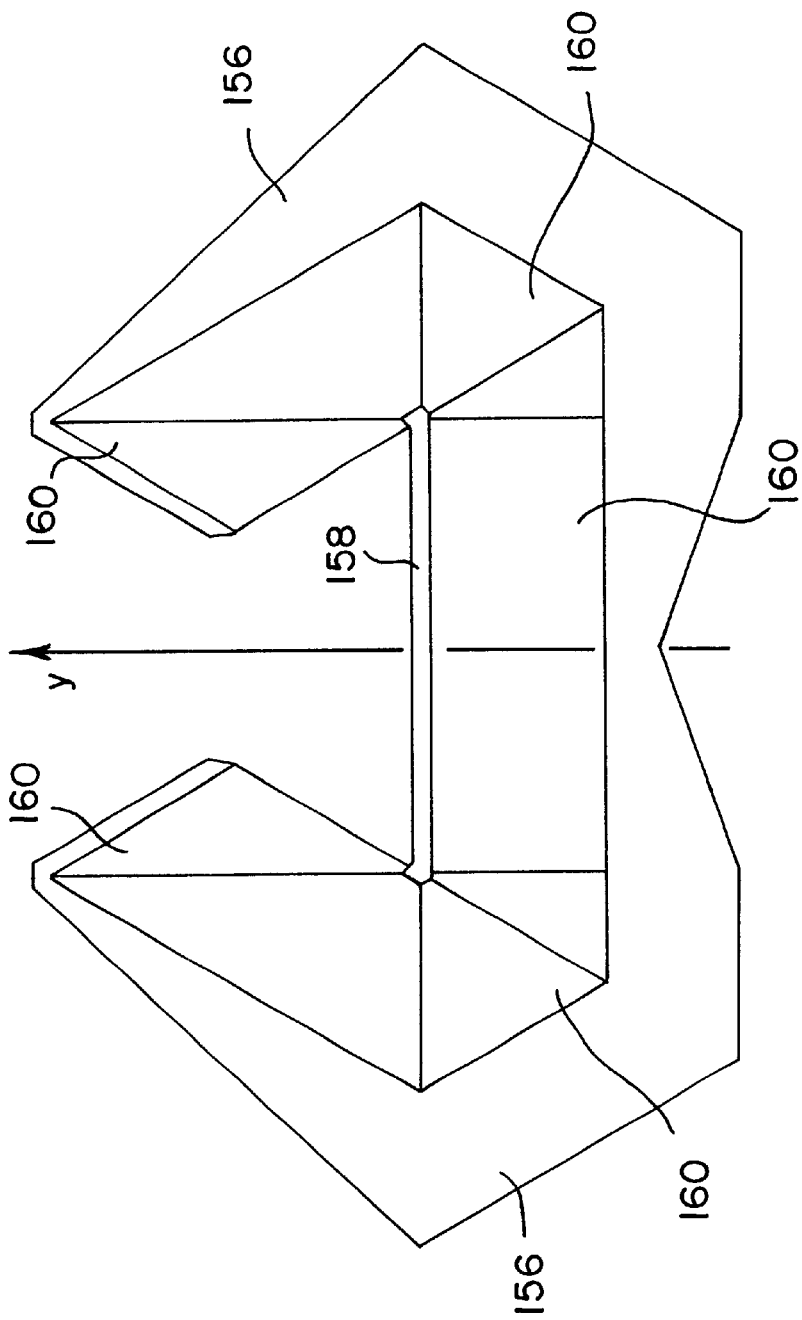
FIG. 19 is a cross sectional view of one form of a yoked magnetic structure in accordance with the invention.

As a general rule, yoked magnets exhibit a higher figure of merit than yokeless magnets and the structures introduced in this application are no exception. In massive magnets, requiring the high values of the remanence of rare-earth materials, the selection of a yoked structure results in a substantial saving in the cost of material. FIG. 19 shows an example of a yoked magnetic structure in accordance with the invention with the yoke indicated at 156, the pole piece of FIG. 7B at 158, and the permanent magnets at 160. However, the addition of the yoke results in a substantially larger dimension of the yoked magnet compared to the yokeless structure. As the value of K increases, an increasingly larger thickness of the yoke is required to make sure that the field within the yoke is everywhere well below saturation, and for large values of K ($K \geq 0.5$), weight and dimensions of the magnet are controlled primarily by the yoke rather than by the structure of magnetic material as illustrated in FIG. 19. As a consequence, the yokeless structure may be the logical design approach in an application where weight and size are at a premium. This is the case of interventional applications where the magnet must be integrated in existing surgical suites with a minimum interference on the surgical procedures.

Figure 20:
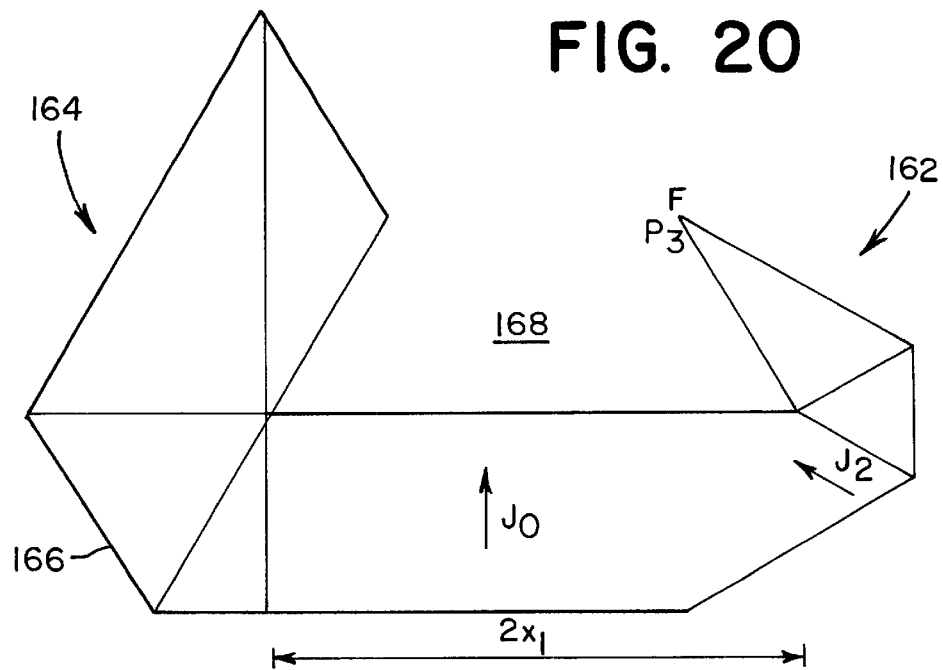
FIG. 20 is a cross sectional schematic view of one form of a hybrid magnetic structure in accordance with the invention.

As previously indicated, yokeless and yoked structures can be combined to form hybrid structures like the L-magnet shown in FIG. 20 designed for K=0.5. The right hand side 162 of the structure is similar to the one computed for the yokeless structure of FIG. 9, for $F \approx P_3$, and the left hand side 164 is a yoked 166 configuration as indicated by the heavy line in FIG. 20. One observes that the cross sections of the hybrid magnet of FIG. 20 and the yokeless magnet of FIG. 9 have identical external boundaries. However the presence of the non-magnetic triangular regions in the yoked section 164 makes the figure of merit of the hybrid structure substantially higher than that of the structure of FIG. 9. The figure of merit of the closed hybrid magnet is $$M=0.105 \tag{48}$$

compared to M=0.077 of the structure of FIG. 9. The shorter yokeless section 162 of the hybrid L-magnet optimizes the access to the region of interest 168 from one side of the magnet. The geometries of FIGS. 20 and 9 establish the rationale of the design of open L-shaped magnets that combine the advantage of maximum access to the region of interest with a minimum fringe field. L-shaped unipolar magnets may provide the optimum solution for the development of open magnets for both clinical and interventional applications.

Figure 20A:
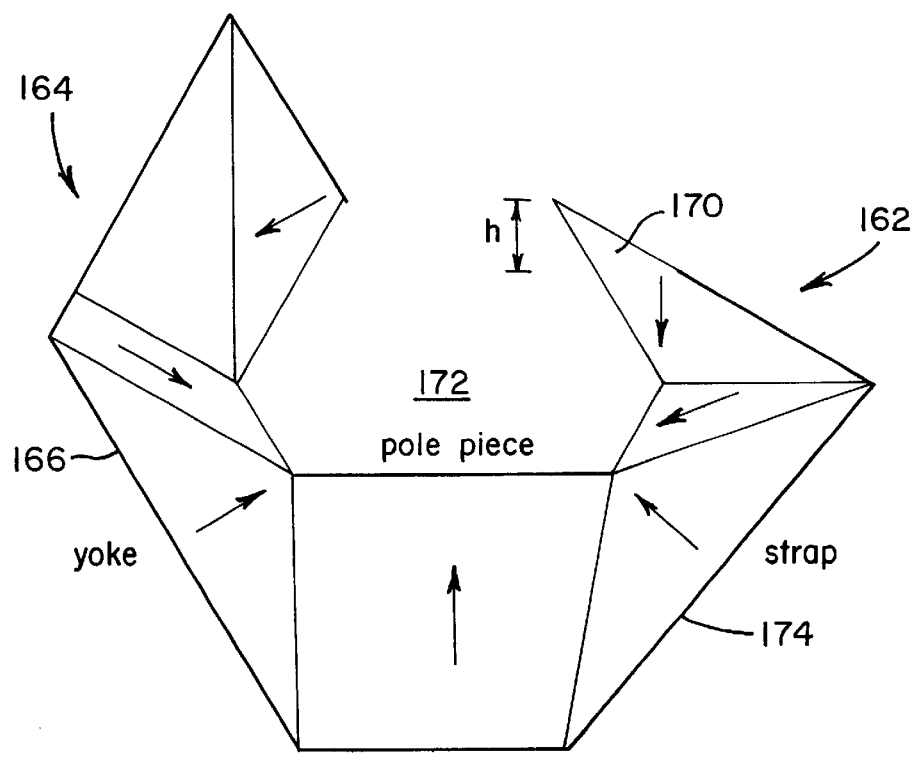
FIG. 20A is a cross sectional schematic view of one form of another hybrid magnetic structure in accordance with the invention.

FIG. 20A shows a modified hybrid magnetic structure in accordance with the invention with the portion 170 on the right that may be removed to improve the access angle to the cavity 172. The heavy line 174 on the right is a strap. FIG. 1 shows a similar hybrid version with the yoke 14 shown in a more accurate representation. Typical dimensions for an L-magnet of the type shown in FIG. 20a are: a minimum cavity width (at its maximum line—see FIG. 3) of about 70 cm, an overall structure height of about 150 cm, an overall structure width of about 150 cm, and a minimum length in the z direction of about 70–80 cm.

Except where explicitly shown otherwise, it will be understood from the context that the magnetic structures shown are orientated with respect to an xyz coordinate system in which the x axis is horizontal, the y axis vertical, the z axis is perpendicular to the plane of the drawing, and the field in the cavity is oriented parallel to the y axis.

8. CONCLUDING REMARKS

The foregoing has described novel structures and a method of generating a uniform magnetic field within a cavity by means of uniformly-magnetized prism-shaped blocks of permanent magnet material. A principal advantage of this approach is that the region of high field uniformity is accessible over a large solid angle. An application where this is important is the integration of medical MRI imaging with procedures needing direct contact with a patient. Magnetic structures in accordance with the invention are characterized by a high permeability ferromagnetic member having a plane surface interfacing with the cavity and forming a single pole piece of the magnetic structure, the remaining magnetic structure collecting the magnetic flux flowing through the single pole piece and through the cavity. The opposite side of the cavity is open to a surrounding medium for accessing the cavity. First, the structure is designed as if a hypothetical high permeability membrane, parallel to the pole piece, closes off the cavity. Then, when the membrane is removed, the field is uniform in the region of interest and suffers only a minor perturbation, which, preferably, can be removed by means of a filter structure as described above. While the asymmetrical L-shaped hybrid structure is preferred for interventional applications, the benefits of the invention can also be achieved with symmetrical yoked, yokeless, and hybrid structures. It will also be appreciated that the cavity may have any arbitrary polygonal shape. The hexagonal cavity has the merit that it's shape more closely matches the oval cross section of a person, whereas the trapezoidal cavity is preferred where weight and size are important. Where reference herein and in the claims is made to, for example, first, second, third, and fourth sides of a cavity, it will be understood that, as indicated above, this does not exclude the presence of additional sides.

It will be appreciated that the method and apparatus of the invention described herein is not limited to MRI systems, though that environment provides a particularly good example to illustrate the unusual flexibility and other benefits available with the construction of the invention.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A magnetic structure for generating a uniform magnetic field within a region of interest within a cavity, comprising:
   a) a plurality of uniformly-magnetized, prism-shaped blocks of permanent magnet material being positioned around a cavity within the magnetic structure leaving an opening allowing access to the cavity,
   b) said magnetic structure having a plane surface comprising a discrete high permeability ferromagnetic member interfacing with the cavity and acting as a single pole piece of the magnetic structure from which magnetic flux constituting the uniform magnetic field flows through the region of interest in the cavity toward the opening, said high-permeability ferromagnetic member being positioned underneath an object when placed within the region of interest to be analyzed in the presence of the uniform magnetic field, said opening being opposed to the high-permeability ferromagnetic member acting as the single pole piece and providing access to the region of interest and to the object when placed therein, said magnetic structure lacking a discrete high-permeability ferromagnetic member acting as a discrete second pole piece at the location of the opening, said magnetic structure portions adjacent the opening collecting the magnetic flux flowing through the single pole piece and through the region of interest in the cavity,
   c) said prism-shaped blocks of permanent magnet material being responsible for the generation of the uniform magnetic field within the region of interest,
   d) said magnetic structure being configured such that a magnetic equipotential surface is formed across the opening.

2. A magnetic structure for generating a uniform magnetic field within a region of interest as claimed in claim 1, wherein the uniform magnetic field is oriented perpendicular to the opening in of the cavity.

3. A magnetic structure for generating a uniform magnetic field within a region of interest as claimed in claim 1, wherein the uniform magnetic field is oriented perpendicular to the high-permeability ferromagnetic member.

4. A magnetic structure for generating a uniform magnetic field within a region of interest as claimed in claim 3, wherein the magnetic structure forms a yoked or a yokeless system.

5. A magnetic structure for generating a uniform magnetic field within a region of interest as claimed in claim 1, further comprising means on the magnetic structure for compensating for distortions in the magnetic field within the region of interest.

6. A magnetic structure for generating a substantially uniform magnetic field within a region of interest as claimed in claim 1, wherein the prism-shaped blocks are positioned within an arbitrary three-dimensional rectangular coordinate system consisting of perpendicular x, y, and z axes to define a polygonal cavity, the magnetic structure being asymmetrical with respect to a yz plane.

7. A magnetic structure for generating a uniform magnetic field within a region of interest as claimed in claim 1, wherein some of the prism-shaped blocks are triangular prisms.

8. A magnetic structure for generating a uniform magnetic field within a region of interest, comprising:
   a) a plurality of uniformly-magnetized, prism-shaped blocks of permanent magnet material each having a magnetization J,
   b) the prism-shaped blocks being positioned within an arbitrary three-dimensional rectangular coordinate system consisting of perpendicular x, y, and z axes to define a polygonal cavity having first and second closed sides and an open side between the closed sides for accessing an object when placed in the cavity, the cavity extending in the z direction,
   c) one or more prism-shaped blocks of the plurality forming a yokeless magnetic system adjacent the first closed side of the cavity, said yokeless magnetic system lacking an external yoke,
   d) one or more prism-shaped blocks of the plurality forming a yoked magnetic system adjacent the second closed side of the cavity, said yoked magnetic system including an external yoke,
   e) the magnetization J in each of the prism-shaped blocks being such that the yokeless and yoked magnetic systems together generate a uniform magnetic field in the cavity within the region of interest, the uniform magnetic field being oriented parallel to the y axis and oriented to extend toward the open side.

9. A magnetic structure for generating a uniform magnetic field within a region of interest as claimed in claim 8, wherein one of the yokeless and yoked magnetic systems has a greater height in the y direction than the other of the yokeless and yoked magnetic systems thereby providing increased access to the cavity from a direction from the side of the other of the yokeless and yoked magnetic systems.

10. A magnetic structure for generating a uniform magnetic field within a region of interest as claimed in claim 9, wherein the yoked magnetic system is the one with the greater height.

11. A magnetic structure for generating a uniform magnetic field within a region of interest, comprising:
   a) a plurality of uniformly-magnetized, prism-shaped blocks of permanent magnet material each having a magnetization J,
   b) the prism-shaped blocks being positioned within an arbitrary three-dimensional rectangular coordinate system consisting of perpendicular x, y, and z axes to define a polygonal cavity having a first side flanked by second and third sides for receiving an object to be examined with the object being positioned adjacent the first side of the cavity, a fourth side of the cavity opposite to the first side being open for accessing the object when in the cavity, the cavity extending in the z direction,
   c) a first prism-shaped block of the plurality having its magnetization J oriented in a direction parallel to the y axis and having a first surface extending in a plane substantially perpendicular to the y axis and located adjacent the first side of the cavity,
   d) one or more second prism-shaped blocks of the plurality forming a yokeless magnetic system adjacent the second side of the cavity, said yokeless magnetic system lacking an external yoke,
   e) one or more third prism-shaped blocks of the plurality forming together with the first prism-shaped block a yoked magnetic system adjacent the third side of the cavity, said yoked magnetic system including an external yoke,
   f) the magnetization J in each of the prism-shaped blocks being such that the yokeless and yoked magnetic systems together generate a uniform magnetic field in the cavity within the region of interest, the region of interest being located adjacent the first side of the cavity, said uniform magnetic field extending parallel to the y axis,
   g) said magnetic structure being configured such that a magnetic equipotential surface is formed across the open fourth side of the cavity.

12. A magnetic structure for generating a uniform magnetic field within a region of interest as claimed in claim 11, wherein the cavity has a rectangular shape, the first side is flat, and a high permeability member covers the first surface of the first prism-shaped block and interfaces with the first side of the cavity.

13. A magnetic structure for generating a substantially uniform magnetic field within a region of interest as claimed in claim 11, wherein the magnetic structure is asymmetrical with respect to the yz plane.

14. A magnetic structure for generating a substantially uniform magnetic field within a region of interest as claimed in claim 11, wherein the open side of the cavity extends perpendicular to the uniform magnetic field.

15. A magnetic structure for generating a uniform magnetic field within a region of interest as claimed in claim 11, wherein some of the second and third prism-shaped blocks are triangular prisms.

16. A magnetic structure for generating a uniform magnetic field within a region of interest as claimed in claim 11, further comprising means on the magnetic structure for compensating for distortions in the magnetic field within the region of interest.

17. A magnetic structure for generating a uniform magnetic field within a region of interest as claimed in claim 11, further comprising high permeability strap members extending within or adjacent some of the prism-shaped blocks.

* * * * *